(12) United States Patent
O'Connor et al.

(10) Patent No.: US 7,378,637 B2
(45) Date of Patent: May 27, 2008

(54) METHOD AND APPARATUS FOR SIGNAL PROCESSING IN A SENSOR SYSTEM FOR USE IN SPECTROSCOPY

(75) Inventors: Paul O'Connor, Bellport, NY (US); Gianluigi DeGeronimo, Nesconset, NY (US); Joseph Grosholz, Natrona Heights, PA (US)

(73) Assignee: Brookhaven Science Associates, LLC, Upton, NY (US)

( * ) Notice: Subject to any disclaimer, the term of this patent is extended or adjusted under 35 U.S.C. 154(b) by 954 days.

(21) Appl. No.: 10/835,092

(22) Filed: Apr. 29, 2004

(65) Prior Publication Data

US 2005/0246140 A1 Nov. 3, 2005

(51) Int. Cl.
*G01J 1/44* (2006.01)
*H01L 31/00* (2006.01)

(52) U.S. Cl. ............................... 250/214 R; 250/214.1

(58) Field of Classification Search ............ 250/214 R, 250/214.1, 208.1, 339.07, 339.08, 227.21, 250/227.22, 227.23, 559.12, 214 DC, 214 SW, 250/214 S, 226; 702/189–199; 327/58–60, 327/62, 89–91, 94, 96; 341/122, 123
See application file for complete search history.

(56) References Cited

U.S. PATENT DOCUMENTS

| | | | |
|---|---|---|---|
| 4,024,398 A | 5/1977 | Hatch | 250/363.02 |
| 5,317,523 A | 5/1994 | Masten et al. | 250/227.11 |
| 6,512,399 B1 | 1/2003 | DeGeronimo et al. | 327/62 |
| 6,720,812 B2 * | 4/2004 | Tumer et al. | 327/170 |
| 6,927,396 B2 * | 8/2005 | Vydrin et al. | 250/367 |
| 7,148,460 B2 * | 12/2006 | Moses et al. | 250/214 R |

OTHER PUBLICATIONS

De Geronimo, et al., "Analog CMOS Peak Detect and Hold Circuits. Part 2. The Two Phase Offset-Free and Derandomizing Configuration", *Nuclear Instruments and Methods in Physics Research A 484*, pp. 544-556 (2002).

De Geronimo, et al., "Analog CMOS Peak Detect and Hold Circuits. Part 1. Analysis of the Classical Configuration", *Nuclear Instruments and Methods in Physics Research A 484*, pp. 533-543 (2002).

(Continued)

*Primary Examiner*—Que Tan Le
*Assistant Examiner*—Pascal M Bui-Pho
(74) *Attorney, Agent, or Firm*—Lori-Anne Neiger

(57) ABSTRACT

A method for processing pulses arriving randomly in time on at least one channel using multiple peak detectors includes asynchronously selecting a non-busy peak detector (PD) in response to a pulse-generated trigger signal, connecting the channel to the selected PD in response to the trigger signal, and detecting a pulse peak amplitude. Amplitude and time of arrival data are output in first-in first-out (FIFO) sequence. An apparatus includes trigger comparators to generate the trigger signal for the pulse-receiving channel, PDs, a switch for connecting the channel to the selected PD, and logic circuitry which maintains the write pointer. Also included, time-to-amplitude converters (TACs) convert time of arrival to analog voltage and an analog multiplexer provides FIFO output. A multi-element sensor system for spectroscopy includes detector elements, channels, trigger comparators, PDs, a switch, and a logic circuit with asynchronous write pointer. The system includes TACs, a multiplexer and analog-to-digital converter.

49 Claims, 17 Drawing Sheets

OTHER PUBLICATIONS

O'Connor, et al., "Amplitude and Time Measurement ASIC with Analog Derandomization", *Nuclear Instruments and Methods in Physics Research A 505*, pp. 352-357 (2003).

De Geronimo, et al., "Analog Peak Detector and Derandomizer for High-Rate Spectroscopy", *IEEE Transactions on Nuclear Science*, vol. 49, No. 4, pp. 1769-1773 (Aug. 2002).

O'Connor, et al., "Amplitude and Time Measurement ASIC with Analog Derandomization: First Results", *IEEE Transactions on Nuclear Science*, vol. 50, No. 4, pp. 892-897 (Aug. 2003).

O'Connor, et al., "Amplitude and Time Measurement ASIC with Analog Derandomization", presented by invitation at the *Symposium on Radiation Measurements and Applications*, sponsored by University of Michigan Nuclear Eng. and Rad. Sciences Dpt. (presented on May 21-23, 2002).

O'Connor, et al., "An Amplitude and Time Measurement ASIC with Analog Derandomization", presented at *IEEE Nuclear Sciences Symposium N12-5*, Norfolk, VA (presented on Nov. 14, 2002).

O'Connor, et al., "An Amplitude and Time Measurement ASIC with Analog Derandomization", presented at an *Instrumentation Division Seminar* for Instrumentation Division, Brookhaven National Laboratory, (presented on Feb. 12, 2003); web-posting of presentation on Apr. 30, 2003 at https://www.inst.bnl.gov/seminars/.

* cited by examiner

METHOD AND APPARATUS FOR SIGNAL PROCESSING IN A SENSOR SYSTEM FOR USE IN SPECTROSCOPY

This invention was made with Government support under contract number DE-AC02-98CH10886, awarded by the U.S. Department of Energy. The Government has certain rights in the invention.

FIELD OF THE INVENTION

The present invention relates generally to sensors for use in spectroscopy and more particularly to efficient signal processing electronics for sensors, especially for multi-element sensors, which can be used for high-speed spectroscopy.

BACKGROUND OF THE INVENTION

Sensors, e.g. multi-element sensors, which produce pulse signals, are in widespread use for radiation detection. Examples can be found in medical imaging, high energy particle tracking, and x-ray astronomy. Multi-element sensors are typically fabricated by subdividing the active area of a planar detector into smaller pixels, thereby improving position resolution, energy resolution, and rate capability. The cost of increasing the segmentation of the detector itself is usually modest. The supporting electronics required to process and readout the large amount of data generated are, however, typically expensive and cumbersome.

For example, one straightforward method typically used to process pulse signals from multi-element sensors with N detector elements is to use N fast analog-to-digital converters (ADCs) and digitize the signals directly after preamplification. This is a brute force approach and leads to high cost and high power dissipation.

Another technique commonly used is to sample the data in the analog domain and multiplex the sampled data into a smaller number of ADCs. Typically, the sampling is performed by N sample-and-hold (S/H) circuits, one for each of the N detector elements. The use of such S/H circuits, however, has several disadvantages. First, the S/H circuit requires a trigger to sample the pulse signal at the proper time. Such trigger signals may be difficult to generate and synchronize with the pulse signals being measured.

In addition, the S/H circuits are unable to process new pulses while "holding" the peak value of a previous pulse; therefore, the circuit incurs so-called "deadtime." Each detector element is associated with a channel over which the data generated by the detector element is delivered. The greater the number of channels that are multiplexed into a single ADC, the longer the deadtime, because the N S/H circuits must all remain in the hold mode until the entire group of N detector channels has completed digitization.

Another disadvantage in using S/H circuits is that all the S/H cells are put into hold mode by the trigger regardless of whether or not they are busy sampling or holding a pulse signal. That is, the trigger signal will occur whenever any one channel is active, and all channels will be held until the multiplexer completes the readout cycle. Finally, the S/H approach does not handle the random rate fluctuations characteristic of many radiation detection problems efficiently. The multiplexer and ADC must be fast enough to respond to pulses arriving at the maximum rate, but they remain idle during periods of low rate.

Yet another system and method used to process pulse signals from multi-element sensors with N detector elements involves the use of a more complicated analog memory or switched capacitor array memory. This data concentration system uses multiple S/H circuits or cells per channel to store many samples of each channel waveform. Upon receipt of a trigger, the memory controller routes samples through an output multiplexer into an ADC. With sophisticated address control, this type of analog memory is capable of storing and reading out samples collected earlier while simultaneously acquiring new samples from the same set of channels. Consequently, the blocking problem of the simple S/H may be avoided, and if a sufficient number of buffer cells are included, the system may be deadtime-free. However, an analog memory or switched capacitor array memory system still requires all channels to be read out each time a trigger arrives.

There is a need in the prior art, therefore, for more efficient sensors, especially multi-element sensors, encompassing less expensive and less complex signal processing electronics, which can efficiently process and digitize the signals at a high-rate, and in the case of multi-element sensors, from a large number of detector elements.

SUMMARY OF THE INVENTION

It is an object of the present invention to provide a signal processing device for spectroscopy that efficiently processes pulses arriving on one or more channels.

It is another object of the present invention to provide a more efficient sensor system encompassing less complex signal processing electronics, which efficiently derandomizes, processes, and digitizes pulses from a large number of detector elements.

The present invention, which addresses the needs of the prior art, relates to a signal processing device for spectroscopy that efficiently processes pulses arriving on one or more channels.

The signal processing apparatus for processing pulses arriving randomly in time on at least one channel, wherein a pulse is associated with a time of arrival and an amplitude, includes at least one trigger comparator, wherein each trigger comparator has a trigger threshold voltage associated therewith. The at least one trigger comparator is associated with the at least one channel and is adapted to generate a trigger signal in response to the amplitude of the pulse exceeding the trigger threshold voltage. The apparatus further includes a plurality of peak detectors and a switch adapted to connect the at least one channel receiving the pulse to one of the plurality of peak detectors in response to the trigger signal. The one of the plurality of peak detectors generates an analog signal representing a peak amplitude of the pulse. The system further includes a logic circuit, where the logic circuit generates a write pointer, which asynchronously selects the one of the plurality of peak detectors to be connected to the at least one channel receiving the pulse. The one of the plurality of peak detectors to be connected is the selected peak detector.

A method of processing pulses arriving randomly in time on at least one channel, wherein a pulse is associated with a time of arrival and an amplitude, uses a plurality of peak detectors. The method includes the step of selecting a first peak detector, wherein the first selected peak detector is asynchronously selected from the plurality of peak detectors, and wherein the first selected peak detector is not busy. The method further includes the steps of inputting a first pulse having a first amplitude on a first channel, wherein the first channel is the at least one channel receiving the first pulse, and generating a first trigger signal in response to the first pulse. The method further includes the step of connecting the first channel to the first selected peak detector in response to the first trigger signal, and detecting a first peak amplitude from the first amplitude of the first pulse.

The method may further include the steps of selecting a second peak detector, wherein the second selected peak detector is asynchronously selected from the plurality of peak detectors, wherein the second selected peak detector is not busy. The method further includes inputting a second pulse having a second amplitude on a second channel, wherein the second channel is the at least one channel receiving the second pulse, and wherein the first channel receiving the first pulse and the second channel receiving the second pulse may be the same or different channels. The method further includes the steps of generating a second trigger signal in response to the second pulse, connecting the second channel to the second selected peak detector in response to the second trigger signal, and detecting a second peak amplitude from the second amplitude of the second pulse. The method further preferably includes outputting a first amplitude signal comprising the first peak amplitude and a second amplitude signal comprising the second peak amplitude in accordance with a first-in first-out queuing sequence.

A sensor system for spectroscopy includes at least one detector element, where the at least one detector element is adapted to generate a pulse in response to an event, and where the pulse is associated with a time of arrival and an amplitude. The system further includes at least one channel, which receives the pulse from the at least one detector element, and at least one trigger comparator, which has a trigger threshold voltage associated therewith. The at least one trigger comparator is associated with the at least one channel and is adapted to generate a trigger signal in response to the amplitude of the pulse exceeding the trigger threshold voltage. The system further includes a plurality of peak detectors, and a switch adapted to connect the at least one channel receiving the pulse to one of the plurality of peak detectors in response to the trigger signal. The one of the plurality of peak detectors generates an analog signal representing a peak amplitude of the pulse. The system further includes a logic circuit, which generates a write pointer. The write pointer asynchronously selects the one of the plurality of peak detectors to be connected to the at least one channel receiving the pulse, where the one of the plurality of peak detectors is the selected peak detector. The logic circuit is responsive to at least one of the trigger signal, a peak found signal from at least one of the plurality of peak detectors, and a read request signal.

As a result, the present invention provides a signal processing device for spectroscopy that efficiently processes pulses arriving on one or more channels. As such, the present invention also provides a more efficient sensor system encompassing less complex signal processing electronics, which efficiently derandomizes, processes, and digitizes pulses from a large number of detector elements.

These and other objects, features, and advantages of this invention will become apparent from the following detailed description of illustrative embodiments thereof, which is to be read in connection with the accompanying drawings.

BRIEF DESCRIPTION OF THE DRAWINGS

FIG. 2b is a schematic diagram showing the second phase (read phase) of the peak detector of FIG. 2a.

FIG. 8b is a timing diagram corresponding to the TAC of FIG. 8a.

FIG. 8c is a block diagram illustrating the pulse rise time mode of the time-to-amplitude converter circuit of FIG. 8a.

FIG. 11b is a plot of the output signals from the peak detectors and time-to-amplitude converters (TACs) resulting from the ASIC of FIG. 11a.

DETAILED DESCRIPTION OF THE INVENTION

The device formed in accordance with the present invention provides a signal processing apparatus for use in spectroscopy that efficiently processes pulses. A sensor system for spectroscopy formed in accordance with the present invention includes the signal processing electronics and at least one detector element.

Figure 1:
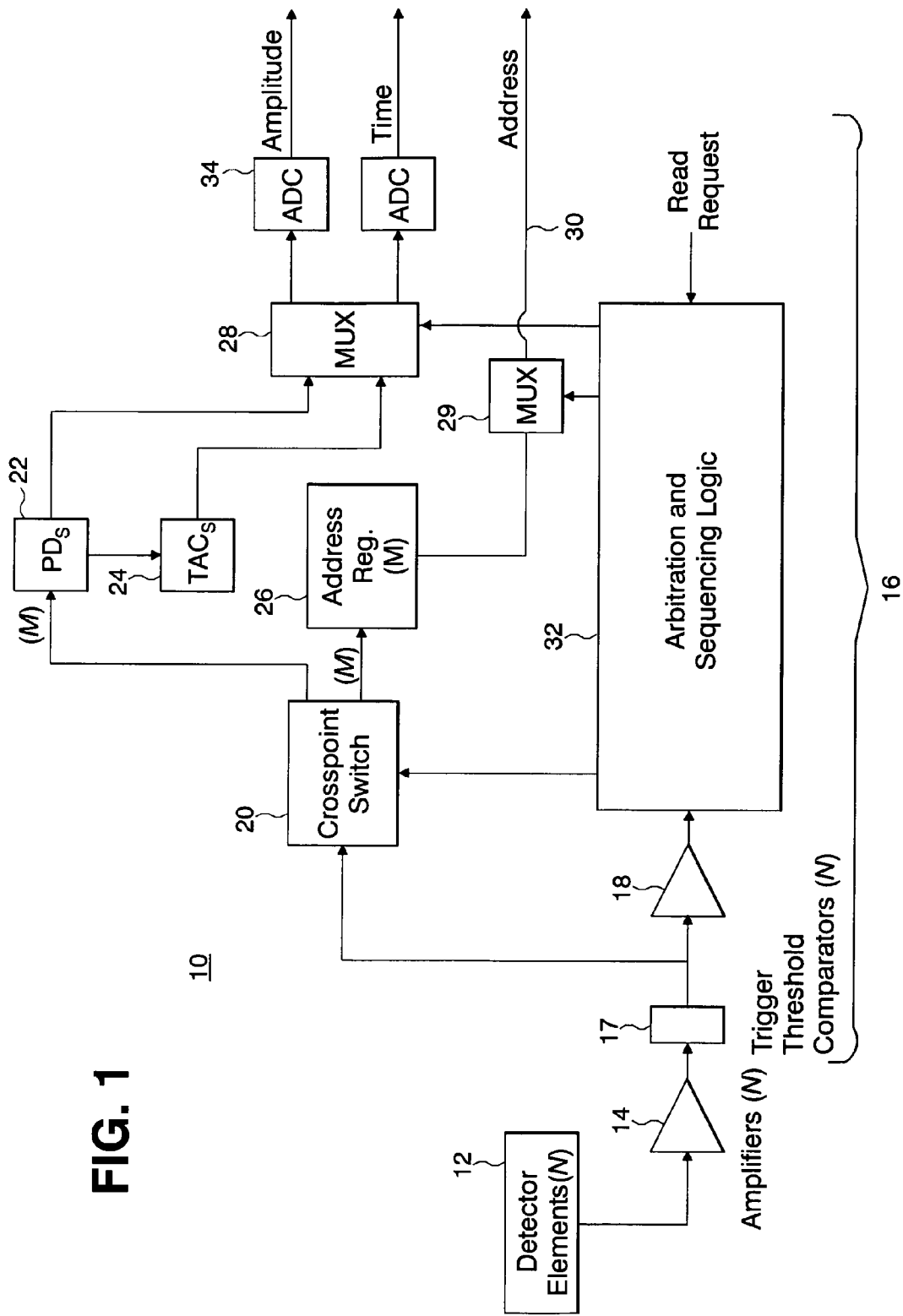
FIG. 1 is a block diagram of a sensor system formed in accordance with the present invention.

FIG. 1 is a block diagram of an embodiment of a sensor system 10 formed in accordance with the present invention. The sensor system 10 includes (N) detector element(s) 12 and (N) amplifier(s) 14, where N is equal to or greater than one (1). The sensor system 10 also includes signal processing electronics 16 which are responsive to signals from the at least one detector element 12, preferably after amplification by the at least one amplifier 14. Pulses are input from at least one amplifier 14 to at least one channel 17 in the signal processing electronics 16, where there are also preferably N channel(s).

In one embodiment, the signal processing electronics 16 may be used as a derandomizer of input pulses. In this embodiment, which is also shown in FIG. 1, the signal processing electronics 16 function to derandomize a number of input pulses to at least one channel 17, where the input pulses are randomly occurring in time. Each channel may accept input pulses from any source. The sources may be any pulse-generating sources, including, but not limited to, detectors or detector elements generating pulses in response to detection of ionizing particles, for example. In this embodiment, a plurality (M) of peak detectors 22 serves as a derandomizing buffer of depth M. Rate fluctuations of the pulses are absorbed. The signal processing electronics 16 preferably include at least one analog-to-digital converter for processing pulse data. The converter preferably works at a more relaxed rate than in conventional systems, which is slightly higher than the average rate of input pulses.

In a preferred embodiment of the sensor system 10 of FIG. 1, N is greater than one (1), and the sensor system 10 is a multi-element sensor system suitable for high-rate imaging spectroscopy. In this embodiment, at least one detector element 12 provides input pulses after amplification by one of the amplifier 14 to the associated channel 17 in the signal processing electronics 16.

In another embodiment, the output from each detector element 12 is first processed by a pulse-shaping circuit. The pulse-shaping circuit includes at least one of a preamplifier, a shaper network, and an antialiasing filter. Preferably, the output of each pulse-shaping circuit is operatively connected to an input of one of at least one trigger comparator 18 in the signal processing electronics 16.

The detector elements of a multi-element sensor of the present invention may be arranged in any geometrical configuration conducive to a particular imaging task. For example, the detector elements may be arranged in a linear array, or in a two-dimensional array conducive to x-ray imaging, or cosmic-ray imaging or in a ring configuration conducive, for example, to positron emission tomography, or magnetic resonance imaging.

The detector elements of the present invention may include any photosensitive device capable of converting photons to an electrical signal, e.g. a current or voltage pulse. As is known by those skilled in the art, the detector element preferably includes a photosensitive material with a peak response at a photon energy of interest.

Preferably, the multi-element sensor formed in accordance with the present invention includes detector elements that are formed from a single wafer of photosensitive material by isolating adjacent photosensitive segments. This is achieved by adding miniscule gaps between adjacent segments. Typically, the detector elements are substantially equivalent in shape and area. Because the segments are formed from a single wafer, the detector elements advantageously possess substantially similar spectral response characteristics.

In another embodiment, the detector elements of the multi-element sensor formed in accordance with the present invention may include independently fabricated sensors placed side by side in any geometric configuration. In the preferred embodiment of the multi-element sensor used for spectroscopic imaging, the detector elements are capable of providing high energy-resolution spectroscopic images, i.e. a mapping of the energy of the radiation impinging on the detector elements. Typically, the energy will be a function of the amplitude of the pulses generated by the detector elements.

An "event" is defined herein as the arrival at a detector element of a photon (e.g. gamma-ray, x-ray, or any ionizing particle) in response to which the detector element generates an electrical impulse, such as a voltage pulse, in an associated detector channel. The electrical impulse, referred to herein as a "pulse" is associated with both the amplitude, which is proportional to energy, and a time of arrival at a detector, also called the "time-of-occurrence."

In positron emission tomography, magnetic resonance, and other types of imaging, the time at which a pulse is generated at a detector element is crucial to accurate imaging. For example, in positron emission tomography, the locations of radioisotopes in an object are imaged. Image location is determined by monitoring the positron emission produced by the radioisotope decay. The positron travels a small distance before combining with an electron during a so-called "annihilation". The annihilation of the positron and electron converts the combined mass into two gamma rays that are emitted at 180° to each other along a so-called "line of coincidence". These gamma rays are readily detectable outside the object, for example, a human body, by gamma-ray detectors or detector elements typically aligned in a ring configuration. The coincidence lines provide a detection scheme for forming the tomographic image. For accurate detection and imaging, coincident hits (hits occurring at substantially the same time) at detectors located on the line of coincidence must be identified.

The signal processing electronics of the sensor formed in accordance with the present invention advantageously provide improved timing resolution of pulses generated by photon events or hits at a detector or detector element, as well as continuous high-speed monitoring of the events over time. In the preferred embodiment of the multi-element sensor system, where N is greater than one, which includes the signal processing electronics 16 as shown in FIG. 1, therefore, the sensor system 10 is suitable for use as a high-speed spectroscopic camera, with any source capable of producing pulse data.

In yet another embodiment, also represented by FIG. 1, the signal processing electronics 16 of the present invention may be adapted for use in a high-rate high-resolution spectroscopy sensor system, with any source capable of producing pulse data. In this embodiment, N is equal to or greater than one (1).

In still another embodiment, N is equal to one (1) in the sensor system 10 of FIG. 1. In this embodiment, the sensor system 10 operates as a high-rate high-resolution spectroscopy sensor system, which includes only one detector and one channel, and a large number of peak detectors. In this embodiment, a pulse rise time of pulses input to one or more channels may be measured instead of a time-of-occurrence associated with the pulses. The pulse rise time is defined herein as the time required for the leading edge of a pulse to rise from a predetermined percent of its peak value to a second predetermined percent of its peak value.

Referring again to FIG. 1, each detector element 12 is associated with a channel 17 over which the data generated by the detector element is delivered. Each channel 17 is also associated with a channel address. In the signal processing electronics 16 of the sensor system 10, therefore, the channel 17 and channel address correspond to the detector element 12 generating a pulse in response to an event occurring at the detector element 12. The pulse generated by the event is associated with an amplitude, which represents the energy of the event, and a time of arrival at the detector 12, or the so-called "time-of-occurrence" of the event.

Referring to FIG. 1, the signal processing electronics 16 preferably include (N) threshold comparator(s) 18, a switch 20, and a plurality (M) of peak detectors (PDs) 22. At least one trigger threshold comparator 18 is associated with at least one channel 17, which is associated with a detector element 12. Preferably, there are the same number (N) of channel(s) 17 as there are trigger comparator(s) 18, and each channel corresponds to a trigger threshold comparator.

The switch 20 is preferably a crosspoint switch 20. In the embodiment shown in FIG. 1, the switch 20 is an N-to-M crosspoint switch. In one embodiment, the number M of peak detectors 22 is the same as the number N of channels 17 and the number N of trigger threshold comparators 18. In another embodiment, the number N of channel(s) 17 and the number N of trigger threshold comparator(s) 18 is less than the number M of peak detectors 22.

In the preferred embodiment of the present invention, where the number N of channels 17 and the number N of trigger threshold comparators 18 is greater than one, N is also preferably greater than the number M of peak detectors. This preferred embodiment is especially useful for multi-element spectroscopic imaging systems, in which the number of detector elements may be several hundred thousand or even over a million.

As shown in FIG. 1, the signal processing electronics 16 of a sensor system 10 formed in accordance with the present invention also preferably include a plurality of time-to-amplitude converters (TACs) 24 and a plurality of channel address registers 26. The electronics 16 also preferably include an analog multiplexer 28, and at least one analog-to-digital converter (ADC). In FIG. 1, ADC 30 digitizes the analog time-of-occurrence signals provided by the TACs 24. A separate digital multiplexer 29 is provided in the embodiment shown in FIG. 1 for reading out the digital channel addresses.

The signal processing electronics 16 also include logic circuitry 32, which includes asynchronous write pointer control circuitry, and preferably read pointer control circuitry. Preferably, a second analog-to-digital converter (ADC) 34 is also provided to digitize the analog amplitude signals provided by the peak detectors 22.

Each trigger comparator 18 is associated with a trigger threshold voltage. The trigger threshold voltage is preferably applied to one input of the comparator 18. The pulses from a channel are applied to a second input of the comparator 18. The trigger threshold voltage is preferably common to each of the comparators 18. Preferably, the trigger threshold voltage is greater than about 0.2 Volts.

In one embodiment, the trigger comparators 18 use a conventional topology consisting of a differential pair with a cross-coupled positive feedback pair. A built-in hysteresis of about 80 mV is typical. The comparator circuit is optimized in one embodiment for unipolar positive-going pulses with a baseline of about 0.3V. Alternatively, as is well-known to those skilled in the art, the comparator circuit may easily be adapted for negative-going pulses.

The PDs 22 of the signal-processing electronics 16 provide analog peak detection. Conventional methods used to extract peak amplitude pulse data have involved the use of sample-and-hold (S/H) circuits to sample the pulse. To avoid a blocking problem, multiple S/H circuits per channel have typically been used with a sufficient number of buffer cells to minimize dead time. The multiple circuits store many samples the waveform associated with each channel, which are later digitized by an ADC. In contrast, the use of analog peak detectors 22 in the signal processing electronics 16 of the sensor 10 advantageously produce the pulse height with only one digitization per channel, minimizing the requirements on the ADC.

The PDs 22 are preferably two-phase PDs that circumvent major sources of error found in conventional configurations, as described, for example, in De Geronimo, Kandasamy, O'Connor, "Analog CMOS Peak Detect and Hold Circuits. Part 2. The Two-Phase Offset-Free and Derandomizing Configuration," *Nucl. Instrum. Methods*, Vol. A 484, pp. 544-556 (2002) (hereinafter "Kandasamy"), which is incorporated herein by reference.

A two-phase PD is also described in DeGeronimo, et al., "Analog Peak Detector and Derandomizer for High-Rate Spectroscopy," *IEEE Trans. Nucl. Sci.*, Vol. 49, No. 4, pp. 1769-1773 (August 2002) (hereinafter "De Geronimo"), which is incorporated herein by reference.

The two-phase peak detector of the present invention advantageously eliminates the errors caused by amplifier offset in prior art peak detectors. This is accomplished by re-configuring the amplifier as a unity-gain follower of the voltage on the hold capacitor, while also providing strong drive capability, as described in De Geronimo.

Typical complementary metal-oxide semiconductor (CMOS) peak detectors employ a metal-oxide-semiconductor (MOS) current source as a rectifying element in the feedback loop of a high-gain differential amplifier. The major source of static error in these prior art PDs is the input offset $V_{OS}$ of the differential amplifier. Conventional techniques to reduce the offset unavoidably compromise speed and dynamic accuracy. Therefore, these typical CMOS peak detectors are unsuitable for high-speed high-precision applications such as high-speed spectroscopy. In addition, the conventional PDs are characterized by limited dynamic range and poor driving capability. The two-phase PD developed and patented by the inventors in U.S. Pat. No. 6,512,399 to DeGeronimo, et al., which is incorporated herein by reference, overcomes these limitations.

Figure 2A:
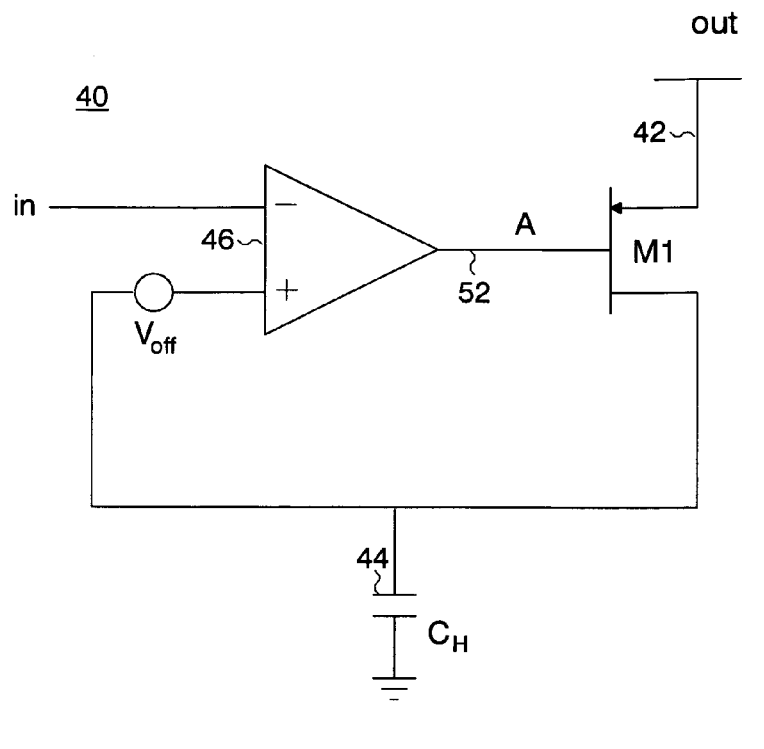
FIG. 2a is a schematic diagram showing a first phase (write phase) of a prior art two-phase peak detector.

Referring to FIG. 2a, as described in DeGeronimo, the first phase of the two-phase PD, the WRITE phase 40, is similar to the conventional design. The P-channel metal-oxide-semiconductor (PMOS) field effect transistor M1 42 conducts while the input is increasing. After a positive peak, it shuts off and the maximum value is stored on a hold capacitor $C_H$ 44. An amplifier offset voltage $V_{OS}$ corrupts a peak voltage $V_{hold}$ stored on $C_H$ 44.

Figure 2B:
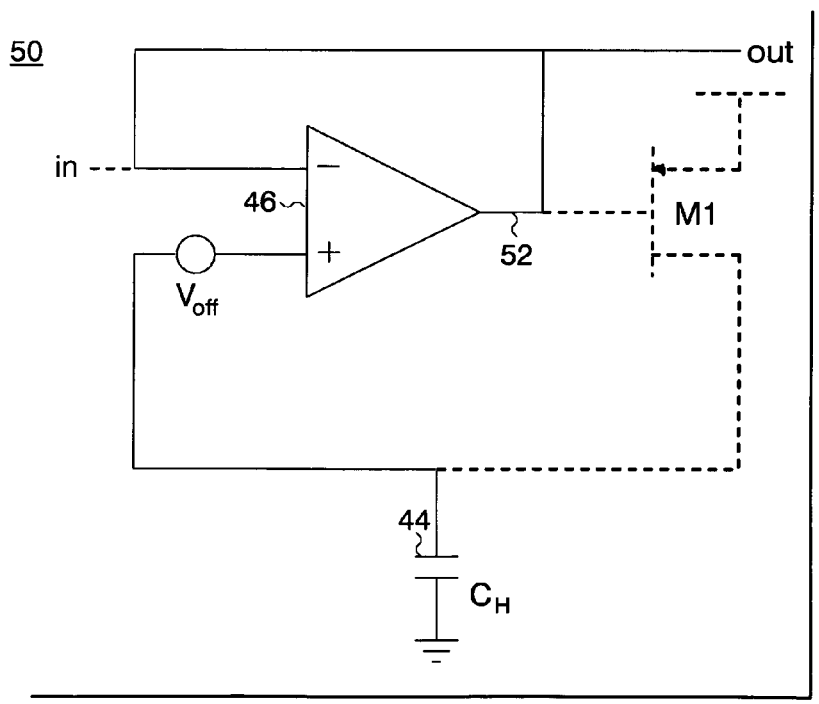

In the second phase, the READ phase 50 shown in FIG. 2b, the circuit is reconfigured by analog switches (not shown) such that the amplifier 46 acts as a unity-gain follower for a voltage $V_{hold}$ held on $C_H$ 44. The offset voltage $V_{OS}$ is now subtracted from the held peak value, thus canceling the error. The gate of M1 42, previously connected to the amplifier output 52, is now connected to a positive supply $V_{DD}$. The total static error, $V_{e,dc}$ of the two-phase configuration is given by the following equation:

$$V_{out} - V_{in,peak} = V_{e,dc} \approx \frac{V_{g,peak} - V_{in,peak}}{A_0}, \quad (1)$$

where $V_{g,peak}$ is the gate voltage of M1 42 in proximity of the peak, $V_{in,peak}$ is the peak voltage of the input and $A_0$ is the dc voltage gain of the amplifier 46. The residual error is preferably minimized by maximizing $A_0$. With the two-phase approach, the finite common-mode rejection of the amplifier is also canceled. Due to the offset cancellation, it is also possible to minimize the size of the input MOSFETs of the differential amplifier, disregarding any mismatch and consequent offset. In this way, additional sources of error due to the MOSFET gate capacitance are further minimized. The circuit in the READ configuration 50 also provides strong drive capability.

By sensing the voltage $V_g$ at the gate of M1 42, the two-phase PD also provides timing measurements that are relatively free of amplitude-dependent time walk since it effectively measures the zero-crossing of the derivative of the input pulse. The positive transition of the voltage $V_g$ corresponding to the peak, followed by a threshold comparator, provides the required timing signal.

By sensing the voltage $V_g$ at the gate of M1 42, the two-phase PD switches automatically from a WRITE to a READ state. The peak detector is then preferably reset by shorting $C_H$ to a threshold dc level. Therefore, the peak detector responds only to peaks exceeding this threshold.

Though the two-phase PD described herein as well as the improved PD 22 of the present invention (see FIG. 1) are discussed in terms of detecting positive peak pulses, it is well-known to those skilled in the art how to modify the circuit to detect negative peak pulses. The present invention, therefore, is by no means limited to detecting positive peak pulses, but can also be used, with modification, to detect negative peak pulses.

In the PD 22 of the present invention (see FIG. 1), the speed and accuracy of the two-phase PD are advantageously improved over the PD design described in either Kandasamy, De Geronimo, or the '399 patent. Some of the improvements to the PD design as well as an embodiment of an ASIC formed in accordance with the present invention are described in O'Connor, et al., "Amplitude and Time Measurement ASIC with Analog Derandomization: First Results," *IEEE Trans. Nucl. Sci.*, Vol. 50, No. 4, pp. 892-897 (August 2003) (hereinafter O'Connor et al.), the disclosure of which is incorporated herein by reference. First, the operational transconductance amplifier within the feedback loop is preferably optimized for better speed and higher rail-to-rail performance. In addition, a lead-lag compensation resistor is inserted in series with the hold capacitor of both phases shown in FIG. 2a and FIG. 2b to provide better stability.

Figure 3:
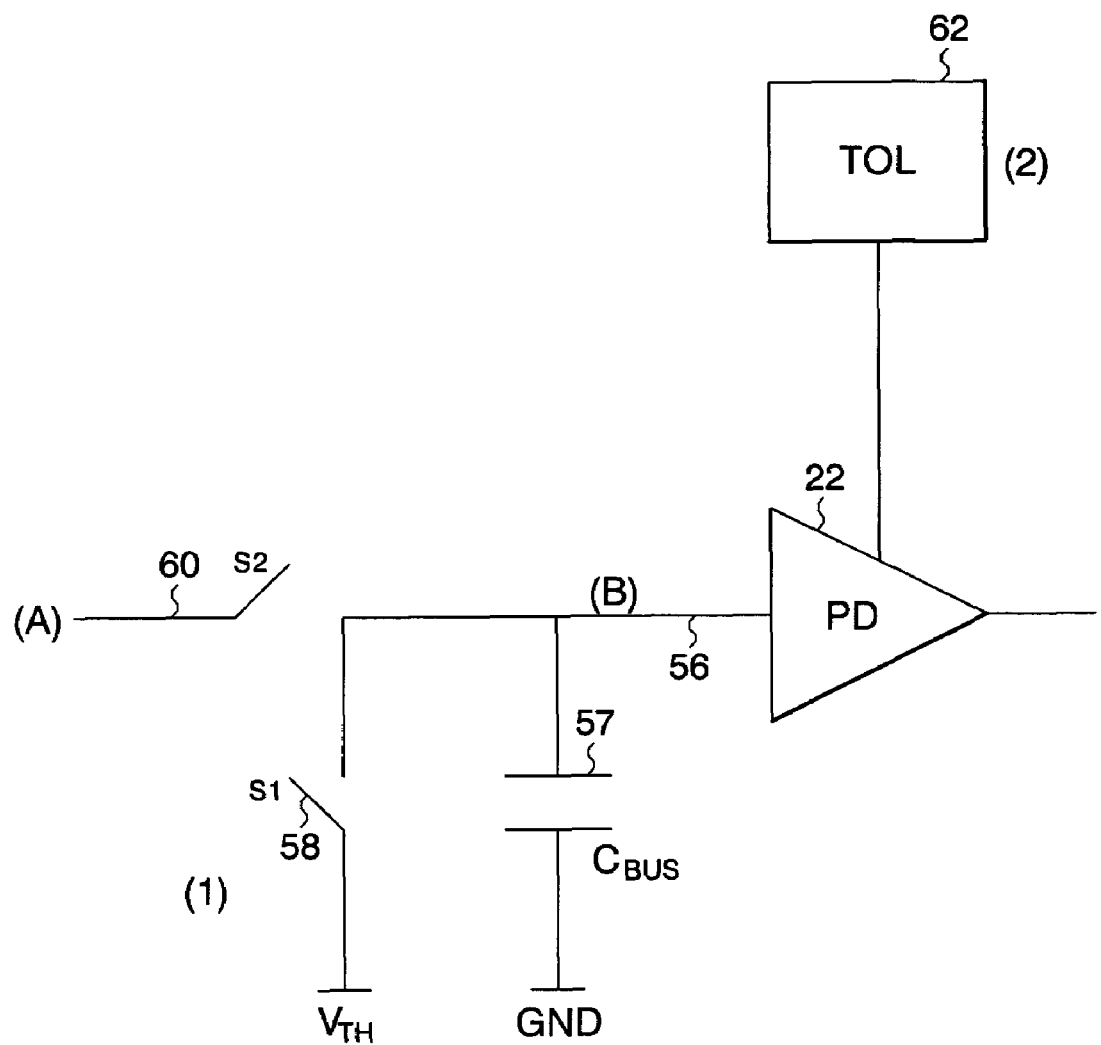
FIG. 3 is a schematic diagram of an embodiment of an improved peak detector of the present invention.

Referring to FIG. 3, two important improvements implemented in the PD 22 of the present invention have significantly improved operation and reliability of the signal processing electronics 16 shown in FIG. 1.

In one embodiment, false triggering is prevented by implementing the step of tying one input of the PD 22 of the present invention to the same trigger threshold voltage that is tied to the inputs of the trigger comparators 18. This step significantly reduces false triggering into the holding phase as follows. Referring to FIG. 3, an input node (B) 56 of the peak detector 22 is precharged to the threshold voltage (VTH) through the switch S1 58, where the threshold voltage VTH is the voltage the same as that applied to the trigger comparators 18. When a pulse having an amplitude exceeding the threshold voltage is input on a channel, the arbitration logic connects the channel to a selected PD.

The precharge must occur while the switch S2 60, which connects the channel to the peak detector 22, is open. In the absence of pre-charging, at the closing of switch S2 60 the input node (B) 56 of the peak detector 22 will be subject to a large voltage swing in order to charge the parasitic bus capacitance CBUS 57 to the input voltage. The voltage swing may generate a false peak that will be processed by the PD 22 in place of the true pulse. The precharging of the input node (B) 56 to the threshold level VTH prevents the voltage swing by equalizing the voltage of the input node (B) 56 to the same threshold level that the arbitration logic responds to by connecting the channel to the PD.

In one embodiment of a method of the present invention, therefore, the method further includes pre-charging an input of the selected peak detector to the trigger threshold voltage before connecting the selected peak detector to the channel receiving the pulse.

Another improvement in the embodiment of the improved PD 22 is shown in FIG. 3. Time-out control is provided by an external timeout logic (TOL) 62, which generates a timeout signal to the peak detector 22. The timeout signal occurs after a predetermined time interval (PTI) and is implemented by opening switch S2 60 in response to the predetermined time interval passing without a peak amplitude being detected. In other words, if no peak is detected during the PTI, the peak detector 22 is reset by the timeout signal and is ready to accept a new pulse. In the absence of any timeout logic, if S2 60 is closed and no peak is detected, which could occur when a pulse has a peak amplitude close to the threshold voltage, then the peak detector remains indefinitely in the tracking state, causing the arbitration logic 46 to lock up. The timeout logic, therefore, prevents lock up of the system by resetting the peak detector 22 after the time interval PTI.

In another embodiment of the method of the present invention, therefore, the step of detecting a peak amplitude includes detecting the peak amplitude of the pulse within a time interval. The method further includes the steps of disconnecting the channel from the selected peak detector in response to not detecting the signal pulse within the time interval, resetting the selected peak detector, and marking the selected peak detector not busy.

The improved PD of the present invention can process pulses with peaking times at least as small as 10 ns with good linearity, in contrast to the 500 ns peaking time described in Kandasamy and De Geronimo. Simulations of the absolute error in peak height for an earlier two-phase PD (Kandasamy) were conducted in O'Connor et al. and compared with simulations of the absolute error in peak height for an embodiment of the PD of the present invention.

Figure 4A:
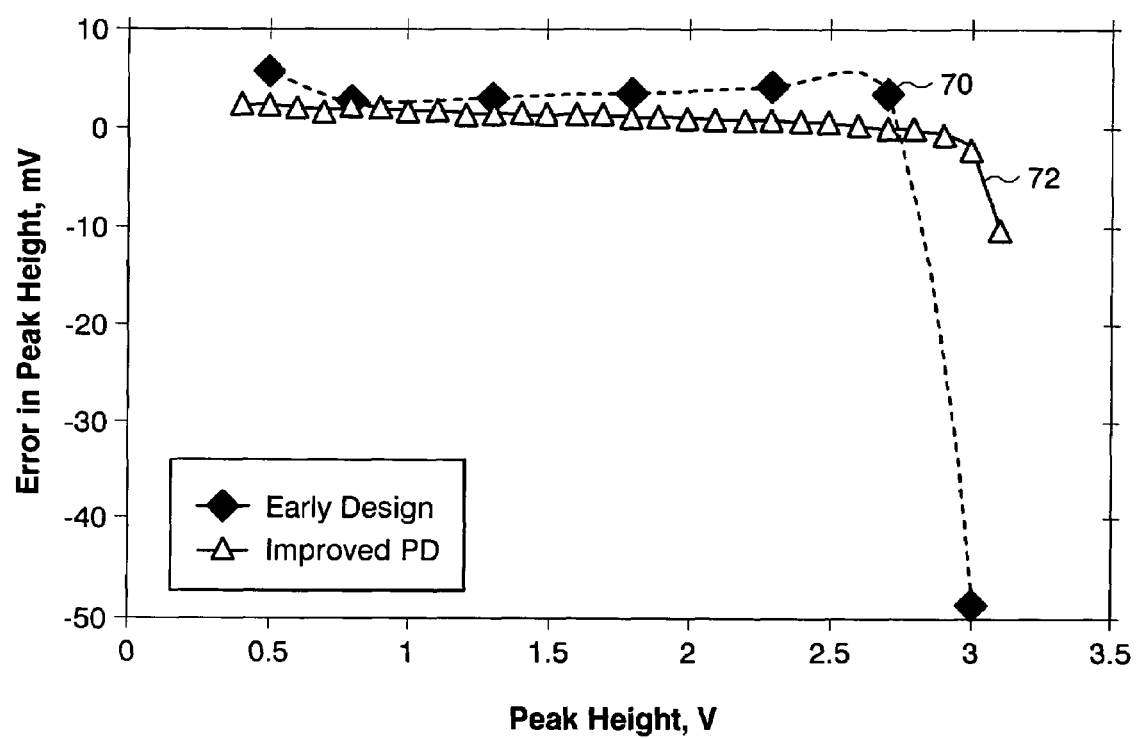
FIG. 4a is a plot comparing pulse height accuracy for a peak detector of the present invention to pulse height accuracy of a prior art peak detector, for a peaking time of 500 nanoseconds (ns).
Figure 4B:
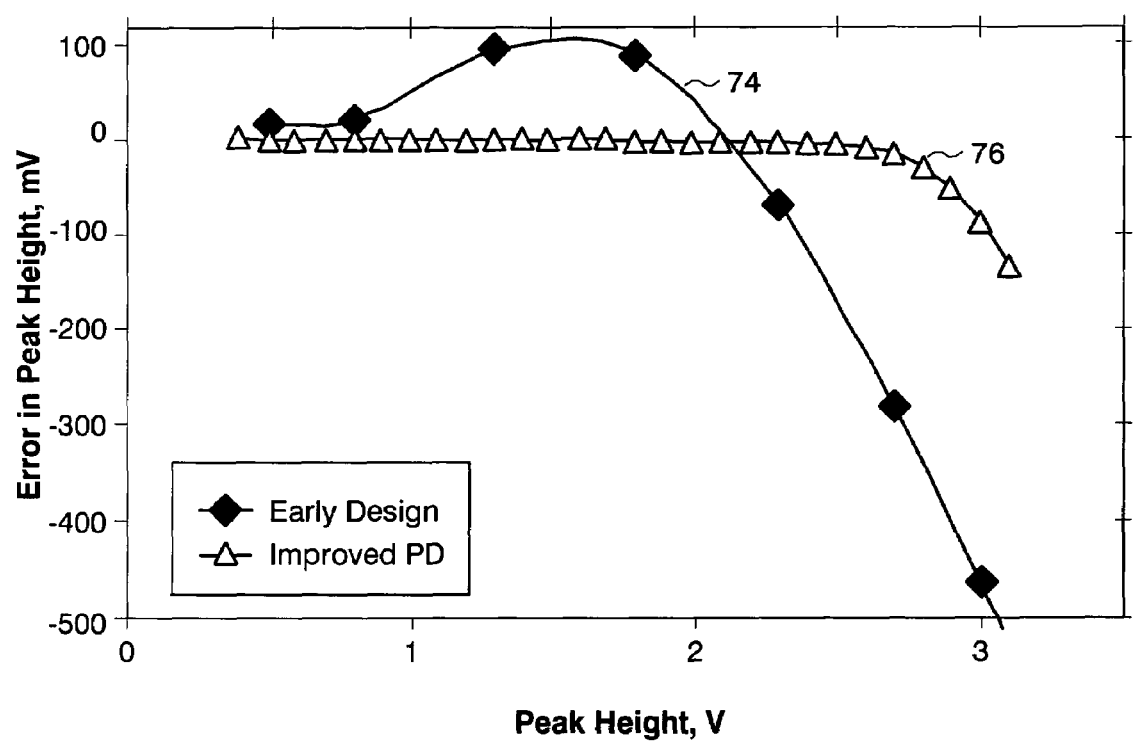
FIG. 4b is a plot comparing pulse height accuracy for a peak detector of the present invention to pulse height accuracy of a prior art peak detector, for a peaking time of 50 ns.

FIG. 4a is a plot comparing the simulated absolute error in peak height for an earlier design of a PD 70 to the simulated absolute error in peak height for an embodiment of an improved two-phase PD 72 of the present invention. FIG. 4a plots the error corresponding to a peaking time of 500 nanoseconds (ns). FIG. 4b plots the absolute error in peak height for the earlier designed PD 74 and the absolute error in peak height for the improved two-phase PD 76 of the present invention corresponding to a peaking time of 50 ns. The error in peak height for the PD of the present invention exhibits substantially better linearity overall, especially for the smaller peaking time of 50 ns plotted in FIG. 4b. The absolute error is also less in both cases for the PD of the present invention for peak heights less than about 2.2 V.

The PD 22 of the present invention (shown in FIG. 1) preferably switches between tracking and holding phases automatically. The PD 22 also preferably provides a time marker (e.g. PK_FOUND) in response to locating the peak amplitude of a pulse, which is used by the arbitration logic 32. The PK_FOUND signal is preferably not delayed more than about 5-10 ns with respect to the pulse peak. The time walk characteristics of the PD 22 are preferably similar to that of a zero-crossing discriminator. Upon receiving a RESET signal, the peak detector 22 preferably switches back into the tracking phase and becomes sensitive to new pulses, preferably within a time preferably less than about 4 ns. A resetting step, therefore, makes the PD 22 available once again to receive and track new pulses, and available to be selected for connecting to a channel.

Conventional techniques for processing multiple pulses from a sensor system involve as many pulse processing circuits and ADC's as there are channels, or detector elements. In the sensor formed in accordance with the present invention, peak detectors are shared among one or more channels receiving pulses by cooperation between the PDs and trigger comparators preferably through a crosspoint switch. As a result, the multi-element sensor 10 shown in FIG. 1 can be made more compact, by choosing the number M of peak detectors to be less than the number N of channels and trigger comparators, due to the reduced components and interconnects between the amplifiers and the ADC. In addition, any channel can make use of any number of available PDs as needed. In other words, PD resources are made available automatically, and on demand, to the most active channel or channels requiring them.

A method of processing pulses arriving randomly in time on at least one channel in accordance with the present invention, therefore, uses a plurality of peak detectors. The method includes selecting a first peak detector, which is not busy, asynchronously from the plurality of peak detectors. The method further includes inputting a first pulse having a first amplitude on a channel and generating a first trigger signal in response to the first pulse. The method then includes connecting the channel receiving the first pulse to the first selected peak detector in response to the first trigger signal, and detecting a first peak amplitude from the first amplitude of the first pulse.

The method also includes the step of selecting a second peak detector, which is not busy, asynchronously from the plurality of peak detectors, and inputting a second pulse having a second amplitude on one of the channels, where the channel receiving the second pulse may or may not be the same channel that received the first pulse. The method further includes generating a second trigger signal in response to the second pulse, connecting the channel receiving the second pulse to the second selected peak detector in response to the second trigger signal, and detecting a second peak amplitude corresponding to the second pulse. Preferably, the method includes outputting a first amplitude signal comprising the first peak amplitude and a second amplitude signal comprising the second peak amplitude in accordance with a first-in first-out (FIFO) queuing sequence.

In operation, the peak detector and trigger comparator operate in concert as follows. Referring to FIG. 1, a channel 17 provides pulses to the inputs of a trigger comparator 18. The step of generating a trigger signal from the trigger comparator includes comparing the pulse amplitude to the trigger threshold voltage. If the amplitude of the first pulse from a channel exceeds the trigger threshold voltage in the comparing step, then the next step is generating the trigger signal for the corresponding channel in response to the pulse. The trigger signal indicates, for example, that the pulse (a so-called "event pulse") was generated by an event at a detector element rather than by a noise source.

In response to the trigger signal, the channel is connected to a selected peak detector in accordance with the connecting step. The selected peak detector is a PD which is not busy, and is asynchronously selected from the plurality of peak detectors. Further processing of the event pulse can then be performed by the peak detector to detect the amplitude of the pulse.

Referring again to the preferred embodiment shown in FIG. 1, preferably, each of the plurality of peak detectors 22 is paired with one of a plurality of TACs 24. The paired PD/TAC array produces separate outputs corresponding to the peak amplitude and time of arrival corresponding to each pulse that is received. There are, therefore, preferably at least M TAC 24/PD 22 pairs, N trigger threshold comparator(s) 18 and N channel(s) 17. The crosspoint switch 20 is preferably an N-to-M crosspoint switch 20.

In the method of the present invention, therefore, the step of connecting a channel receiving a pulse to a selected peak detector in response to a trigger signal is preferably performed by closing a switch in the N-to-M crosspoint switch between the channel and the selected PD.

Figure 5A:
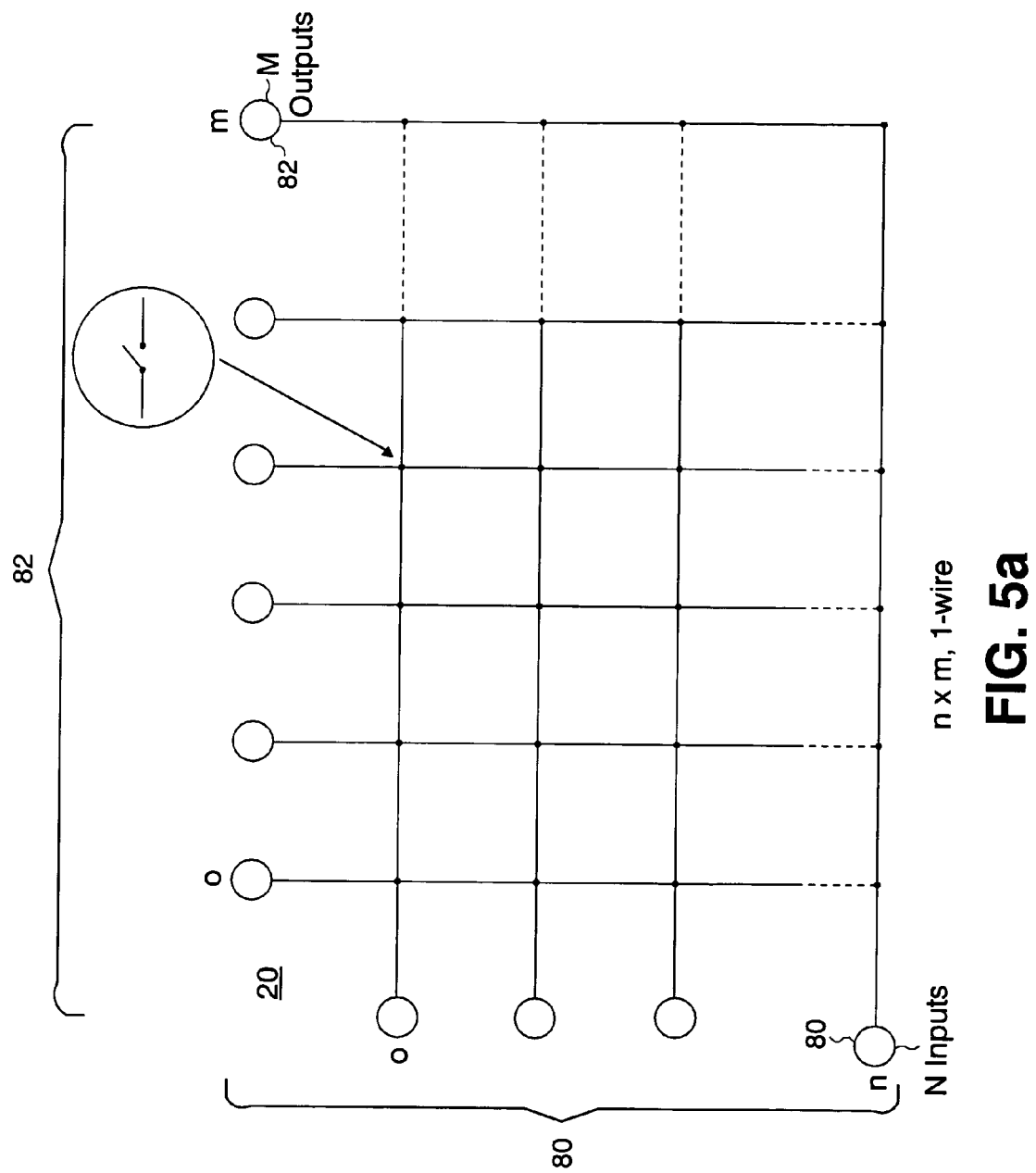
FIG. 5a is a pictorial representation of a prior art N-to-M crosspoint switch.
Figure 5B:
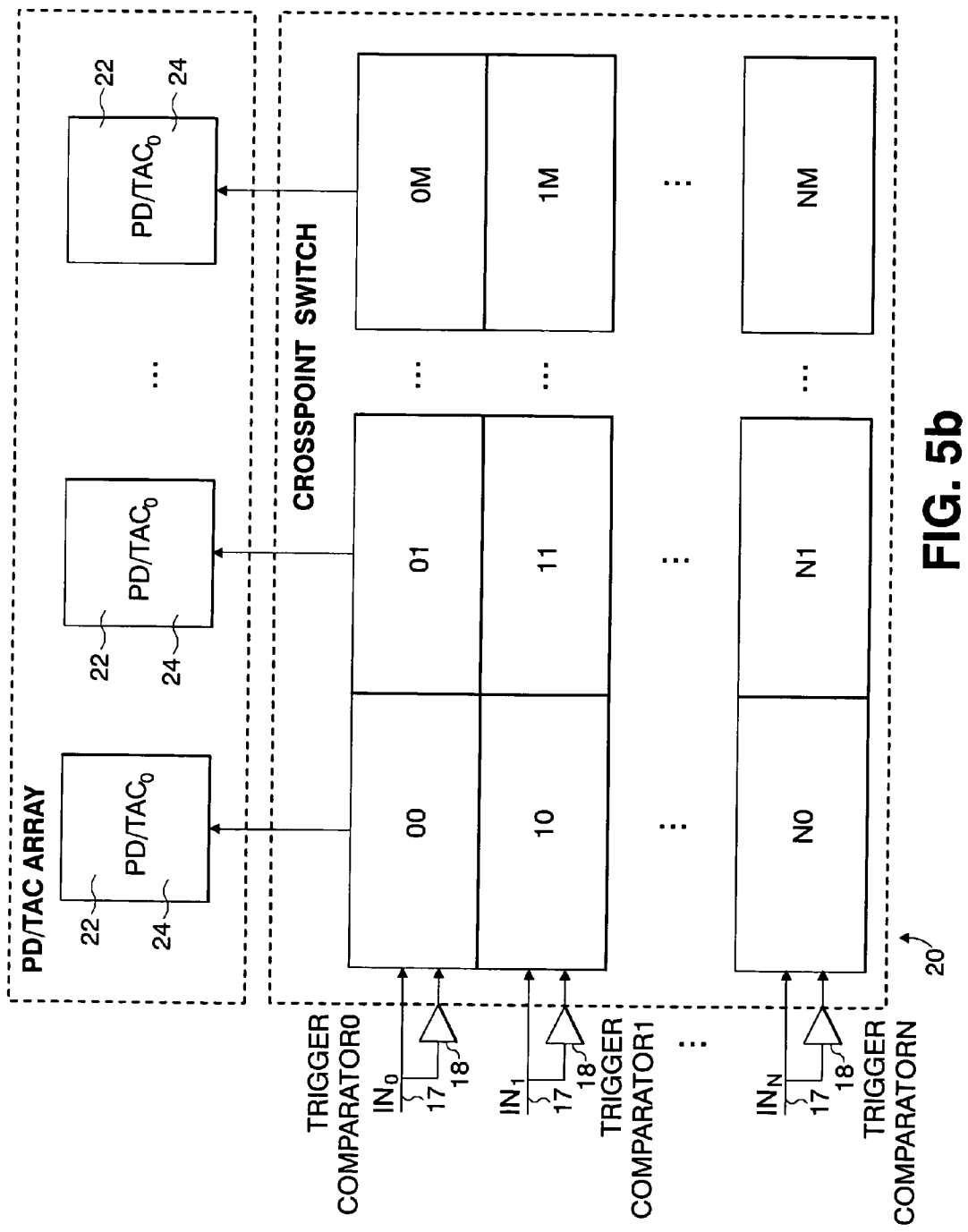
FIG. 5b is a block diagram of part of the sensor system of FIG. 1 illustrating the N-to-M crosspoint switch connections between the channels and PD/TAC arrays.

Referring to FIG. 5a and FIG. 5b, an N-to-M crosspoint switch 20 may be represented as an array of N×M blocks. In one embodiment, the array includes an addressable matrix of N×M CMOS switches. FIG. 5a represents a simple model of a single-pole crosspoint switch 20 having N inputs 80 and a number of M outputs 82. In operation, the switches are initially open before any pulses are received, as shown in FIG. 5a, with no connections being made to the output. In response to the trigger signal corresponding to channel i, the crosspoint switch 20 closes the switch corresponding to channel i, where i is an integer from 1 to N, receiving the pulse, and one of the plurality (M) of peak detectors 22, and enables a connection in the crosspoint switch 20 between channel i and one of the plurality (M) of peak detectors 22, e.g. PD j, where j is an integer from 1 to M.

Figure 5C:
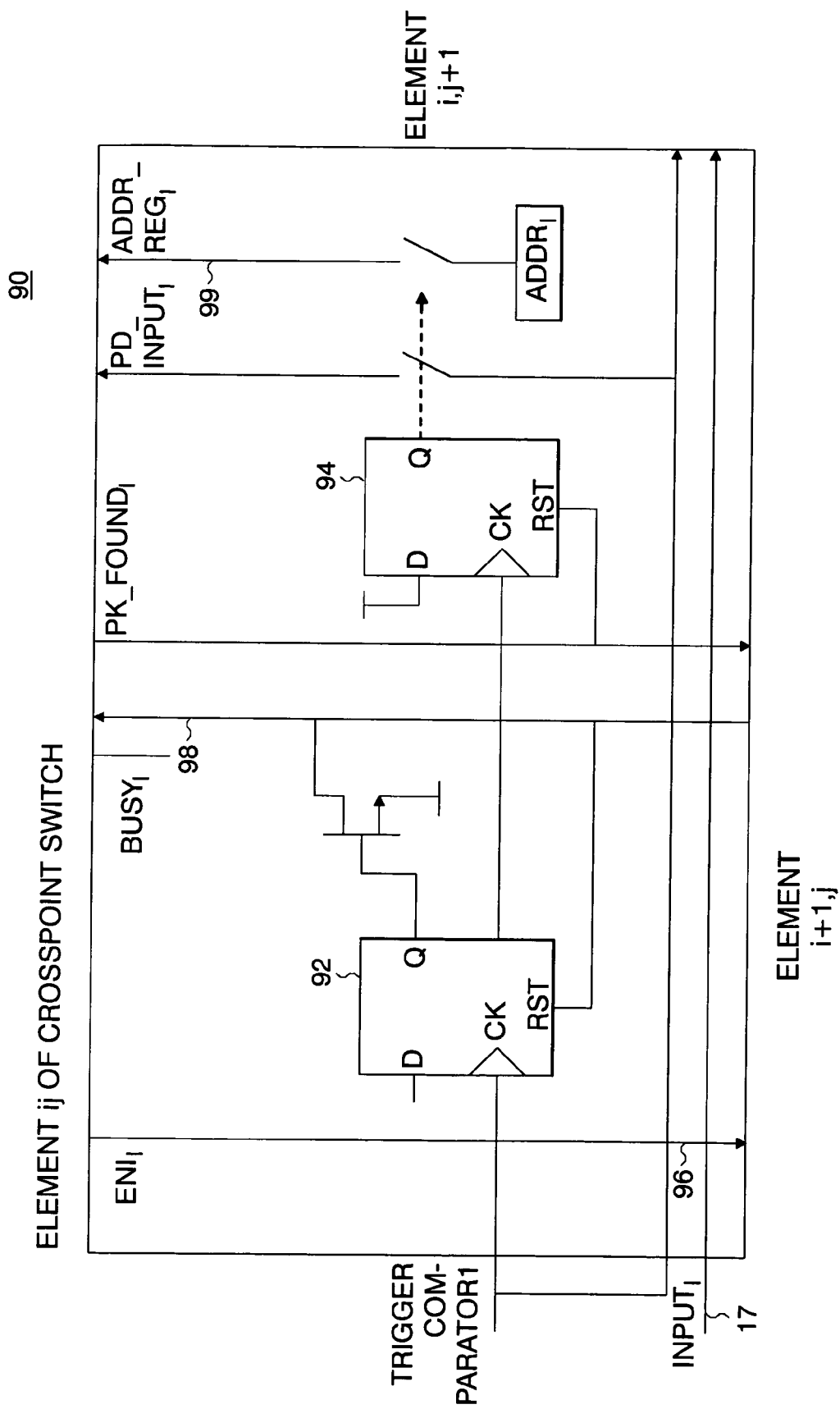
FIG. 5c is a schematic diagram of one embodiment of an element of an N-to-M crosspoint switch of the present invention.

Referring to FIG. 5b, elements of the arbitration logic are preferably co-located with the crosspoint switch blocks. In one embodiment shown in FIG. 5c, an element i, j 90 of a crosspoint switch includes a first flip-flop 92 and a second flip-flop 94. Referring to FIGS. 5b and 5c, an above-threshold input pulse arriving on a channel 17 causes the trigger comparator i associated with this channel to fire. This will set the first flip-flop 92 of the element i, j 90 so that signal ENIj 96 is high, which is the write pointer. A $BUSY_j$ 98 signal is preferably pulled down (wired-or connection down the column) briefly. The second flip-flop 94 is also set, closing the crosspoint switch element i, j 90, thus connecting the channel i to a selected peak detector, $PD_j$. The address of the hit channel ($ADDR_i$) 99 will also be provided up the column to be stored in a selected address register associated with the selected peak detector $PD_j$.

The selected PD j is preferably a first available PD in a sequence, which is not busy tracking or holding a pulse. Preferably, the sequence is a predetermined sequence. The step of selecting a PD, therefore, preferably includes selecting the selected PD from a sequence, preferably a predetermined sequence.

The selected peak detector that is connected to the channel i carrying the event pulse (via the crosspoint switch) enters a tracking mode during which the amplitude of the event pulse is tracked. The tracking mode persists until a peak amplitude is found. The PD 22 then generates an analog signal representing a peak amplitude of the pulse, and holds the peak amplitude in a hold capacitor of PD j. The peak amplitude corresponds to the energy of the event recorded by the detector element associated with the channel i.

When the peak is detected, a peak found signal is preferably issued and the crosspoint connection between amplifier i and PD j is disconnected. The method of the present invention, therefore, further preferably includes the steps of disconnecting the channel receiving and tracking the pulse from the selected peak detector in response to detecting the peak amplitude.

Preferably, the peak amplitude of the pulse is also stored and held on the hold capacitor of PD j. During the time that peak detector j is tracking and then holding, PD j is preferably marked busy. While PD j is busy, however, the remaining free (not busy) peak detectors are preferably able to process other pulses arriving on any input channel. Subsequent pulses arriving on any channel including the same channel the first pulse arrived on, are similarly routed to a next available PD, preferably using arbitration and sequencing logic circuitry 32, as shown in FIG. 1.

Figure 6:
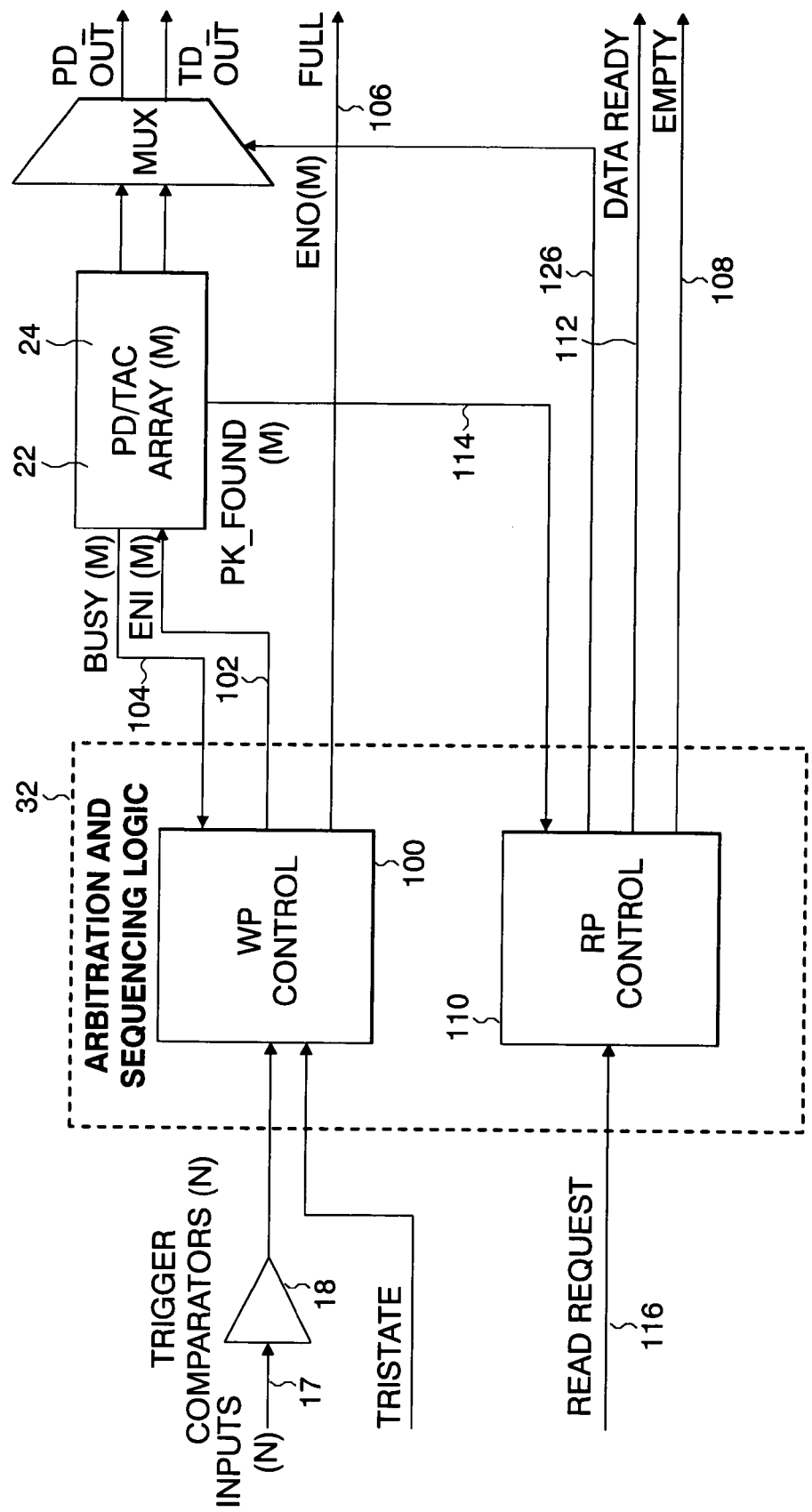
FIG. 6 is a block diagram of an embodiment of the present invention, illustrating the operation of the logic circuit.

Arbitration logic is preferably asynchronous and responds to three types of events: the trigger comparator firing, a peak found signal from the PD, and a read request signal from an external data acquisition system (DAQ). Referring to FIG. 6, the logic 32 preferably includes WP control circuitry 100, which maintains a write pointer (WP). The WP controls access to the PD/TAC pairs in the PD/TAC array.

The write pointer (WP) always points to the next available PD which is not busy either tracking or holding data, in accordance with a sequence. The next available PD is one of the plurality of peak detectors 22, which is not currently marked busy, i.e., not busy tracking or storing a pulse. In addition, the next available PD is preferably selected in accordance with a write sequence from the plurality of PDs 22 that are not busy. The next available PD becomes the selected PD for connection with a channel carrying a newly arriving event pulse.

Preferably, the write sequence is applied to a predetermined sequence of peak detectors. The write pointer enables the crosspoint switch 20 to connect the next arriving pulse to the proper PD in the predetermined write sequence. As soon as the connection is established in the crosspoint switch 20, the write pointer preferably advances to the next available PD (which is not busy) in accordance with the predetermined sequence.

The cycle starts with the write pointer pointing at a first PD ($PD_0$) in the sequence. The write pointer is preferably enabled by raising a signal $ENI_0$ 102, which is the write signal corresponding to $PD_0$. The write pointer then proceeds sequentially.

Arrival of the first pulse exceeding the threshold voltage preferably places $PD_0$ in the BUSY state, which is so indicated by the signal $BUSY_0$ 104 going high, and the WP is incremented. When any $PD_j$ becomes busy, WP is again incremented and it points at $PD_{j+1}$. If the last of the plurality of peak detectors in the array (denoted $PD_M$ where there are a total of M peak detectors) becomes busy, WP points at $PD_0$ and the WP cycle starts again.

If all PDs are simultaneously busy, then incoming events are blocked, and the cycle stops, preferably asserting a FULL flag or signal 106. At this time, WP is pointing at the PD which contains the oldest data, and which will be read out first, in accordance with a FIFO queuing sequence. When the data in a peak detector has been read out, it is preferably marked not busy and the WP cycle restarts from that point.

In one embodiment, the logic 32 also maintains an empty flag and a full flag to aid in monitoring the rate of pulse arrival relative to the rate of the read request signal. If all PDs become empty, then WP is reset to $PD_0$ and an EMPTY flag on signal 108 is asserted. If all PDs 22 are busy when a pulse arrives, the full flag is asserted and the pulse is rejected. Additional pulses are rejected until one or more of the PD's becomes empty.

An embodiment of the method of the present invention includes rejecting a pulse in response to each of the plurality of peak detectors being busy.

Also in response to the trigger signal, two other pulse parameters are preferably generated. The channel address corresponding to the detector element that detected the event is stored as a digital signal in one of the plurality of address registers.

In addition, when the connection is enabled between the channel and one of the plurality of peak detectors 22, a TAC paired with the PD circuit monitors a time interval corresponding to either the time-of-occurrence or pulse rise time of the pulse. In another embodiment of the method of the present invention, therefore, the method also includes converting the time interval to an analog signal to be read out, preferably in FIFO sequence. The analog signal associated with the time-of-occurrence is referred to herein as a "time amplitude signal" to distinguish it from the "analog signal" corresponding to the energy of the event, which is generated by the peak detector.

In another embodiment of the sensor 10 formed in accordance with the present invention, the signal processing electronics 16 also include a priority encoder. A finite amount of time, so-called "set-up time," is required for the logic 32 to establish the crosspoint switch connection between amplifier i and PD j. If two pulses (on different channels) arrive within a time shorter than this setup time, the priority encoder rejects one of the two pulses in accordance with a priority scheme. Preferably, the logic circuitry 32 provides the arbitration to process the simultaneous pulses. In one embodiment of the method of the present invention, the priority scheme includes rejecting the pulse associated with a higher channel address.

Preferably, fast wired-OR allows the logic 32 to discriminate between comparator events from different channels occurring about 3 ns apart. In accordance with a priority scheme, if more than one event arrives within 3 ns, priority is given to the event on the lowest numbered channel and the events on the higher numbered channels are rejected. The impact of this preferential treatment of the low numbered channels is a small bias in favor of the lower numbered channels. However, the bias is negligibly small in most practical cases. In the device described in O'Connor et al., for example, the bias amounts to less than about 0.04% at the highest expected count rate.

In another embodiment of a method of the present invention, the step of blocking is implemented. Blocking includes masking one or more channels from transmitting signals. The step is implemented by disabling the input of the trigger comparator that normally receives pulses from a channel. Therefore, the sensor system of the present invention may be operated with only one channel, with all channels, or with some other fraction of the channels available to receive pulses and connect to the plurality of peak detectors. This embodiment is useful for blocking a channel which is functioning abnormally, for example, in the event that noise from the channel might otherwise saturate a PD.

In another embodiment of a method of the present invention, the step of locking is included. The step of locking utilizes a configuration which allows any channel to be routed directly to the output, bypassing the switch, the PDs, and the analog multiplexer. After the step of locking, the step of measuring the baseline voltage of at least one pulse arriving on at least one channel is performed. This baseline voltage measurement can not be accomplished with the peak detectors. Locking, therefore, provides a better measurement of the pulse amplitudes.

Referring again to FIG. 6, the logic 32 also preferably includes read pointer control logic 110, which maintains a read pointer and a data ready signal 112. In operation, the data ready signal 112 is true if there are any occupied peak detectors, i.e. at least one PD has detected a pulse peak and is still storing the peak amplitude as an analog signal on its hold capacitor. The PDs can preferably store the pulse height for a long time (several milliseconds) without significant degradation.

Preferably, a peak found signal 114 is issued in response to at least one peak detector detecting the peak amplitude, the corresponding analog signal now being ready to be read out. The step of outputting the pulse data in the method of the invention, therefore, preferably includes outputting data (channel signals, amplitude signals from the PDs, and time amplitude signals from the TACs) in response to a read request signal 116 issued, for example, by a data acquisition system. The pulses are preferably read out in accordance with a first-in first-out (FIFO) queuing sequence.

In accordance with a FIFO queuing sequence, the read pointer points to the PD that is holding the "oldest" data, i.e. the one holding the pulse that arrived first in time. The logic 32 preferably establishes the read sequence, reading out the PDs holding pulse data in the same order they were written.

Figure 7:
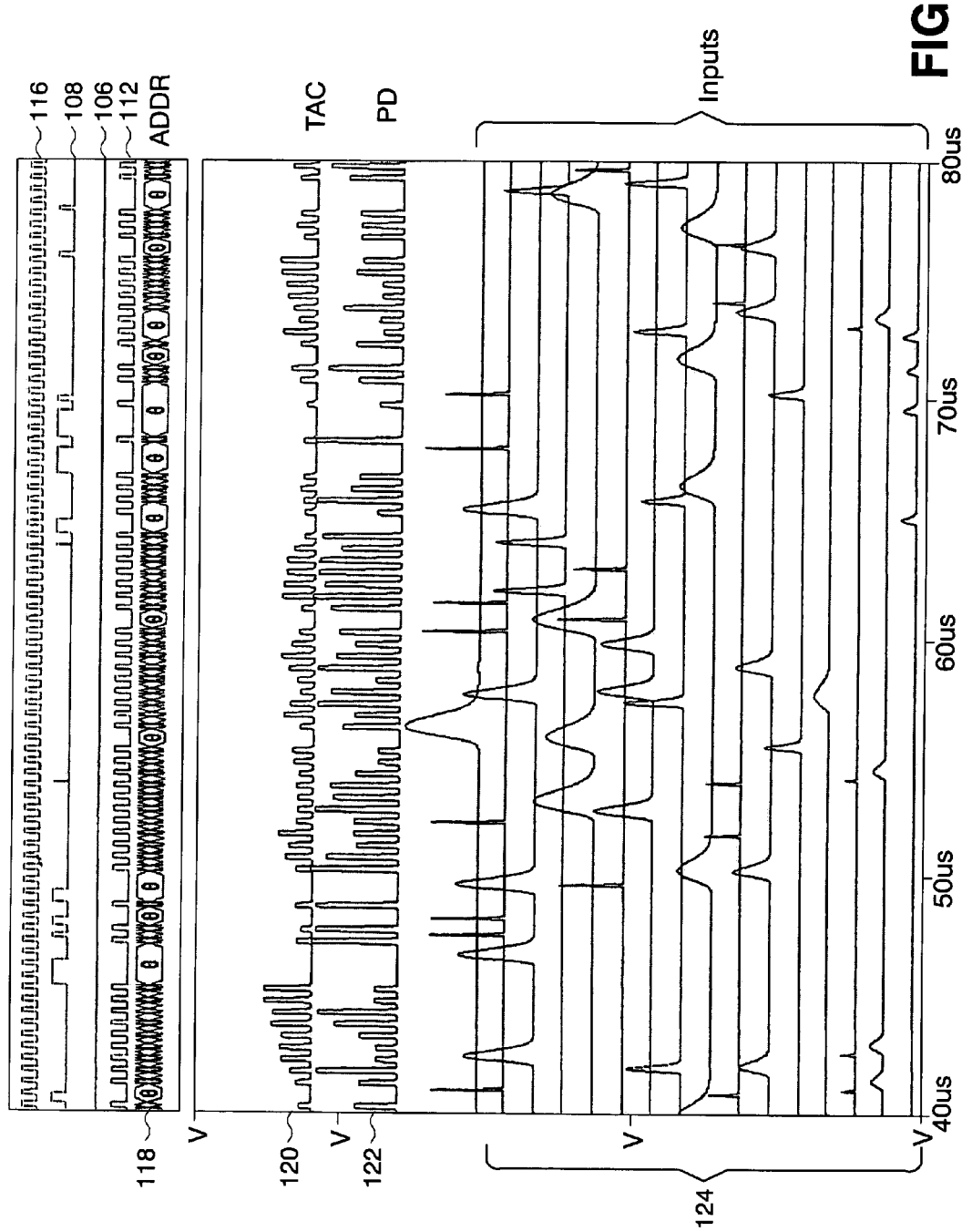
FIG. 7 is a portion of a timing diagram produced from an embodiment of the present invention.

Referring to FIG. 7, a digital channel address signal is read out on one line 118, an analog TAC signal (time analog signal) is read out on a second line 120 and the amplitude analog signal including the peak amplitude signal is read out on a third line 122.

The cycle preferably starts with the read pointer (RP) pointing at the peak detector holding the oldest data in the sequence, e.g. $PD_j$. The read pointer moves to the peak detector holding the oldest data at the time, in response to the read request signal 116, proceeding in accordance with the sequence.

The read request signal 116 is preferably one pulse from a clock signal, as shown in FIG. 7, i.e., the read request signal is asserted periodically. FIG. 7 is a typical timing diagram generated from simulations of an embodiment of the apparatus formed in accordance with the present invention. The incoming pulse signals 124 are shown for sixteen (16) channels in FIG. 7. Referring also to FIG. 6, assuming RP is pointing at $PD_j$, if data ready 112 is true and the peak found signal ($PK\_FOUND_j$) 114 has been asserted for detector $PD_j$ when the read request signal 116 arrives, the data from $PD_j$ is made available to be read out preferably by raising an output enable signal ($ENO_j$) 126. If DATA_READY 112 is false when READ_REQUEST signal 116 arrives, the RP keeps pointing at $PD_j$.

Once the data in $PD_j$ has been read out, the $PD_j$ is reset and RP points to $PD_{j+1}$. If all PDs are empty or tracking, then RP is reset to point at $PD_0$. Due to the logic sequence, RP is always pointing either at $PD_0$ or at the PD that contains the oldest data.

In operation, if the ADC 34 (see FIG. 1) is ready to convert, the read request signal 116 goes high. In response to the read request signal 116, if data ready is true, the multiplexer 28 connects the output of the PD indicated by the read pointer to the ADC 34. The ADC converts the analog signal representing the peak height into digital form. When the read request signal goes low, the multiplexer 28 disconnects the PD from the ADC 34 and the PD is reset and becomes available to receive a new pulse.

The operation of the ADC is included in a further embodiment of a method of the present invention, which includes digitizing the amplitude analog signals and time amplitude signals.

The write and read sequences for extracting the other pulse parameters, that is, one of the time of arrival and pulse rise time of the pulse, and the address of the channel corresponding to the received pulse, are preferably the same. When the trigger signal is generated by the trigger comparator, the address of the channel corresponding to the detector element recording the event is stored as a digital signal in one of the plurality (M) 26 of address registers. The same write and read pointers control access to the address registers 26, so the address information is recorded and output in the same FIFO order as the peak heights.

One embodiment of the method of the present invention, therefore, also includes: selecting an address register, which is not busy, asynchronously from the plurality of address registers, preferably in accordance with a sequence; generating a channel signal which includes the channel address in response to the trigger signal; storing the channel signal in the selected address register; repeating these steps for subsequent pulses; and outputting the channel signals corresponding to the received pulses in FIFO sequence.

Similarly, the TACs that are paired with the PDs are controlled by the same write and read pointers. The time amplitude analog signals stored on the TACs are, therefore, read out in accordance with the same FIFO sequencing. The time amplitude signals are preferably digitized at the same time as the analog amplitude signals from the PDs using a second ADC 30.

Figure 8A:
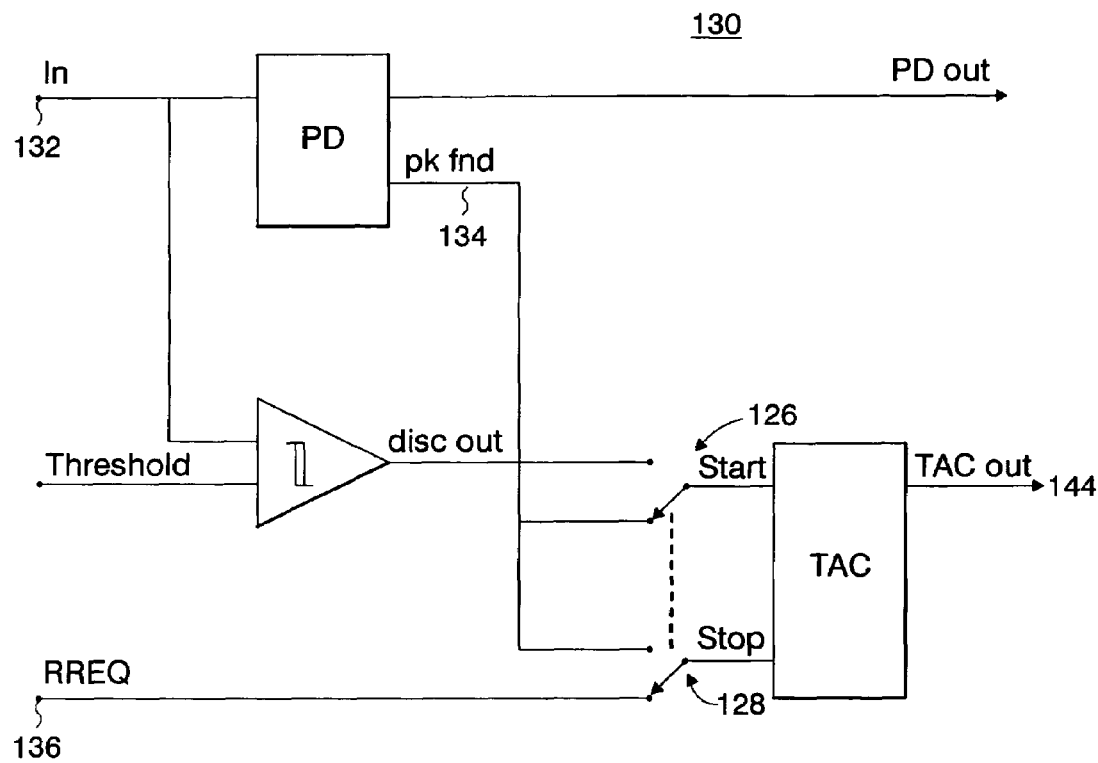
FIG. 8a is a block diagram illustrating the time-of-occurrence mode of a time-to-amplitude converter (TAC) circuit of the present invention.
Figure 8B:
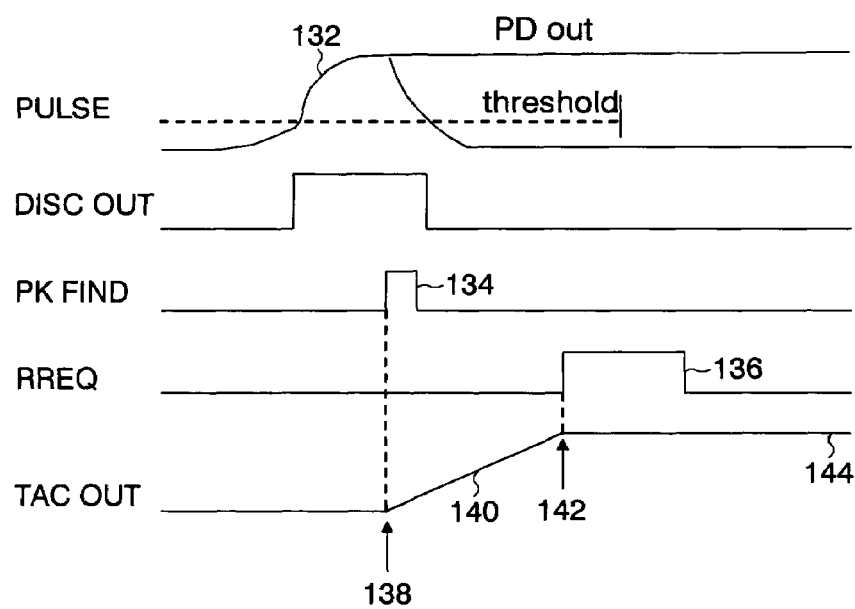
Figure 8C:
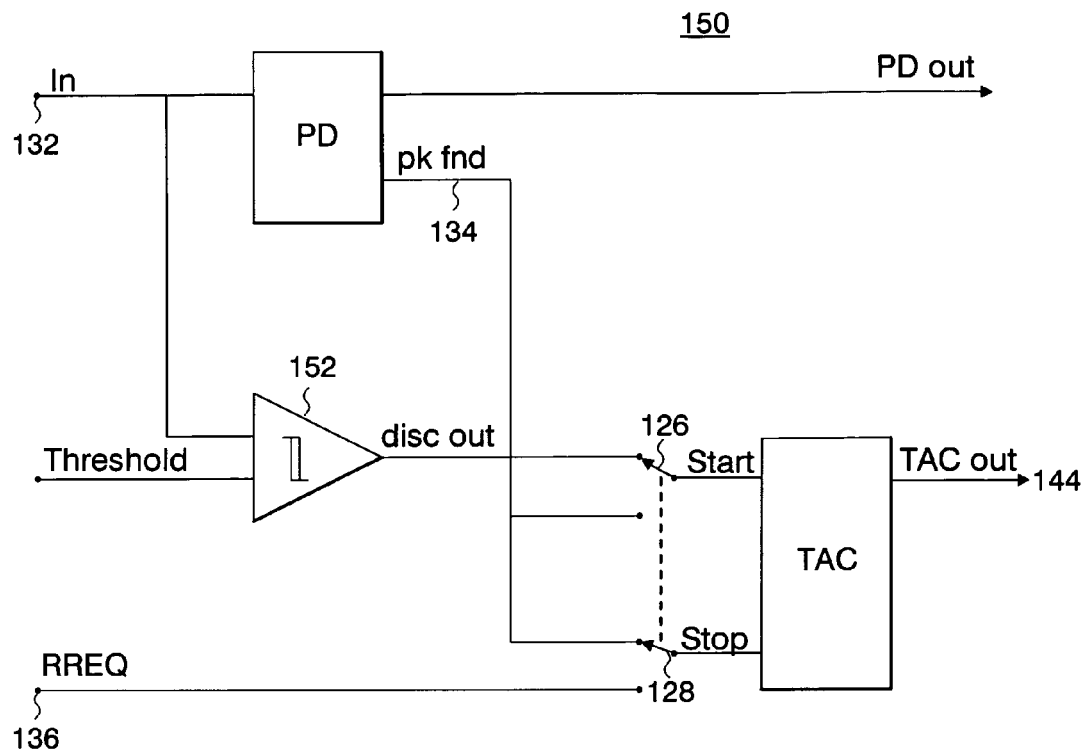

The TAC of the present invention can operate in two different modes: time-of-occurrence and pulse rise time mode. Referring to FIG. 8a and FIG. 8c, the TACs can be operated in either one of the two modes by configuring a start switch 126 and a stop switch 128 to trigger a voltage ramp on and off in response to different signals, depending on the mode of operation.

In many imaging applications, a measurement of the time-of-occurrence is crucial. In one embodiment 130 represented in FIG. 8a, the TAC is operated in the time of arrival or time-of-occurrence mode, to allow time-of-occurrence measurement of the pulse simultaneously with energy measurement of the pulse (energy corresponds to peak amplitude measured by the peak detector). FIG. 8b is a timing diagram of the circuit shown in FIG. 8a.

In this embodiment 130, the TAC is configured as shown in FIG. 8a to measure the time-of-occurrence of the pulse 132 as a time interval between the peak found signal 134 and the read request signal 136. In other words, the leading edge 138 of the peak found signal 134 provides a start signal or start trigger, which initiates a linear voltage ramp 140. The leading edge 142 of the read request signal 136 provides the stop signal or stop trigger which preferably terminates the voltage ramp 140, allowing measurement of the hit time relative to a (known) system clock. The time interval between the leading edge 138 of the peak found signal 134 and the leading edge 142 of the read request signal 136 is thus converted to a voltage difference, which is the time amplitude analog signal represented by "TAC OUT" 144 in FIG. 8a. TAC OUT 144 corresponds to the time-of-occurrence of the event.

Yet another embodiment of a method which includes converting a time interval to a time amplitude signal, therefore, includes converting the time interval associated with a time of arrival, which further includes first generating a voltage ramp signal, which starts at an initial voltage, in response to detecting the first peak amplitude. The method further includes reading a stop voltage at the time of the first read request signal, and measuring the time amplitude signal as a difference between the stop voltage and the initial voltage.

In another embodiment of the present invention, a measurement of the pulse rise time is desirable. In this embodiment, the signal processing electronics are used in conjunction with at least one high-resolution detector element to generate high-resolution energy curves, or spectroscopic scans (also called "spectra") of detected events. The at least one detector element may be any detector capable of producing pulses in response to ionizing photons or particle hits. In a preferred embodiment, the sensor includes at least one Cadmium Zinc Telluride sensor for recording gamma-ray energy spectra of received pulses.

In this embodiment, the output from the at least one detector element is preferably first processed by a pulse-shaping circuit before being input to the corresponding channel. The pulse-shaping circuit preferably includes a preamplifier system.

As is known to those skilled in the art, the amplitude of the shaped pulse output from a pulse-shaping circuit may be undesirably decreased. This decrease is typically referred to as the "ballistic deficit." The pulse rise time from the pulse-shaping circuit corresponds to the charge collection in the detector itself. In detectors with a time-varying charge collection time, leading to a varying ballistic deficit, i.e. to a varying peak amplitude, a degradation in energy resolution occurs, since the peak amplitude is proportional to the energy of the event. As is well-known to those skilled in the art, ballistic deficit variation can be a limiting factor in attaining high energy resolution of gamma-ray spectra, especially when obtaining pulses at a high input rate.

Figure 8D:
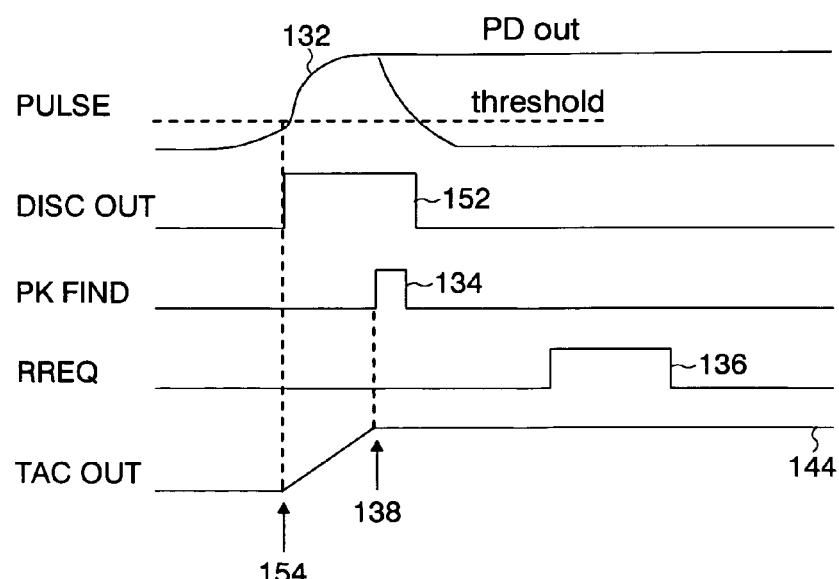
FIG. 8d is a timing diagram corresponding to the TAC of FIG. 8c.

In the embodiment shown in FIG. 8c, the TAC is advantageously configured to operate in rise time mode, allowing for correction of ballistic deficit on a pulse-to-pulse basis by sensing the peaking time or rise time for each pulse. FIG. 8d is a timing diagram of the circuit shown in FIG. 8c. In this mode, the leading edge 154 of the trigger signal 152 provides the start signal and the leading edge 138 of the peak found signal 134 provides the stop signal. The time interval between the threshold crossing 154 and peak amplitude is thus converted to a voltage difference. The voltage difference is the time amplitude analog signal 144 output by the TAC, which corresponds to the pulse rise time of the event.

Still another embodiment of the method which includes converting the time interval to a time amplitude signal, therefore, includes converting the time interval associated with a pulse rise time, which further includes first generating a voltage ramp signal, which starts at an initial voltage, in response to the trigger signal. The method further includes reading a stop voltage in response to detecting the first peak amplitude, and measuring the time amplitude signal as a difference between the stop voltage and the initial voltage.

In yet another embodiment of the apparatus of the present invention, a second time-to-amplitude converter (TAC) is associated with each PD. The second TAC preferably operates as a time-out control, which resets the PD after a known delay. This feature helps to prevent a PD from being locked out of the arbitration sequence in case of an anomalous comparator firing. The second TAC can be used to reject pulses based on a rise time constraint or as a latency delay in systems with a delayed global trigger.

Both the main TAC and the secondary TAC are preferably based on an on-chip 2 pF capacitor charged by a cascoded p-channel constant current source. The ramp voltage is tracked by a two-phase peak detector substantially similar to the one used to detect pulse amplitude. Full scale is preferably able to be varied from 0.5 to 64 by changing the ramp current source by means of an on-board 3-bit digital to analog converter (DAC).

Referring again to FIG. 1, once the analog signals are generated corresponding to the peak amplitude of the pulse and either the time-of-occurrence or pulse rise time of the pulse, they are preferably digitized and read out in either serial or parallel fashion. The analog multiplexer 28 outputs each of the plurality of PDs 22 and each of the plurality of TACs 24 to the respective analog-to-digital converter. Preferably, the multiplexer 28 is an M-to-1 analog multiplexer, where the number of inputs M corresponds to the number of outputs M 82 from the crosspoint switch (see FIG. 5a). M also preferably corresponds, therefore, to the number of TACs 24, PDs 22 and channel registers 26. Similarly, the channel addresses from each of the M registers 26 are preferably read out via a separate digital M-to-1 multiplexer (not shown in FIG. 1).

The step of outputting in the method according to the present invention, therefore, preferably includes connecting the selected peak detector to an analog multiplexer. In the embodiment including M PDs, the analog multiplexer is an M-to-1 multiplexer.

In a preferred embodiment, where N>M, N being the quantity of input channels, the circuit architecture of the present invention advantageously concentrates the data, providing a high level (N:1) multiplexing. This scheme advantageously requires a smaller number of ADCs to process the channels than conventional systems require.

In a preferred embodiment, the signal processing electronics of the multi-element sensor of the present invention advantageously operate to concentrate data from multiple sensors or sensor elements producing random pulses. The electronics receive the randomly-occurring pulses from at least one channel and produce a constant-rate stream of pulse-peak samples at the output, as well as timing and address information for each pulse. The use of the peak detectors combined with logic circuitry function to derandomize the pulses.

In one preferred embodiment, the outputs from signal processing electronics are read out by a DAQ. In response to a rising edge on the READ_REQUEST signal, the amplitude (analog), time (analog), and channel address (digital) are presented to the DAQ. If more than one pulse is being buffered, the pulses are read out by successive READ_REQUEST signals in the same sequence that they were recorded, i.e., in first-in first-out order. When READ_REQUEST signal goes low, the peak detector that was read out is preferably reset and made available for newly arriving data.

In a preferred embodiment, the signal processing electronics are adapted for implementation in an ASIC. In one embodiment which encompasses an ASIC, while the READ_REQUEST signal is low, the outputs are tri-stated, so several ASICs can be bussed together to expand the number of channels processed by a single ADC.

The ASIC formed in accordance with the present invention also preferably has FULL, EMPTY, and DATA_VALID signals. The full signal indicates that all of the peak detectors captured pulses since the last READ_REQUEST signal and any pulses arriving after the last captured pulse were not processed. In multichip applications, the empty flags can be programmed to be asynchronous. In this mode, the EMPTY flag signals from the ASIC can interrupt a central controller, which can then be directed to collect data from the ASIC requesting service. Preferably the comparator, arbitration logic, crosspoint switch, peak detector and TAC load the inputs of the ASIC by less than 2 pF.

Simulations of an embodiment of an ASIC formed in accordance with the present invention have been presented in O'Connor et al. as well as in P. O'Connor, G. De Geronimo, and A. Kandasamy, "Amplitude and Time Measurement ASIC with Analog Derandomization," *Nucl. Instrum. Methods*, Vol. A 505, pp. 352-357 (2003) (hereinafter O'Connor, DeGeronimo et al.), the disclosure of which is incorporated herein by reference.

Figure 9:
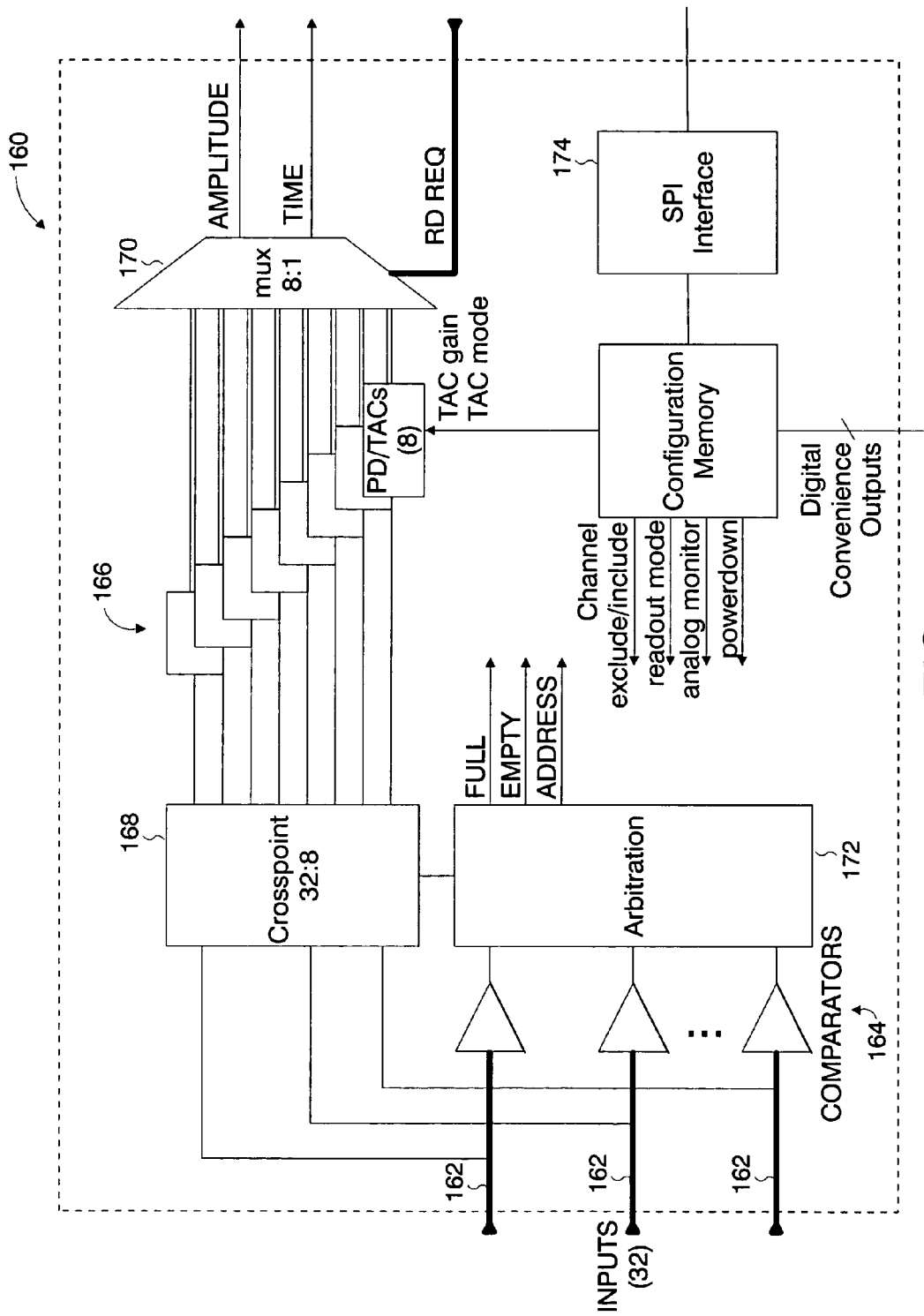
FIG. 9 is a block diagram representing a preferred embodiment of an ASIC formed in accordance with the present invention.

A preferred embodiment of an ASIC 160 formed in accordance with the present invention is illustrated by the block diagram of FIG. 9. The ASIC includes single-ended inputs 162 for thirty-two (32) shaped, positive unipolar pulses, preferably with minimum peaking time of at least 20 ns. An equal number (32) of trigger comparators 164 with common threshold trigger voltages are also provided. The ASIC 160 also includes a smaller array of eight offset-free two-phase peak detectors with associated TACs 166, and a 32-to-8 crosspoint switch 168 (addressable matrix of 256-CMOS switches) that can route any input channel 162 to any PD/TAC 166. The ASIC 160 also includes fast nonblocking arbitration logic to control the crosspoint switch 168, and an output multiplexer 170 and arbitration and sequencing logic 172 to control the readout of the peak detector (PD)/TACs.

Traditional FIFO control signals (FULL, EMPTY, DATA_VALID, READ_REQUEST) are preferably available for operating the ASIC in continuously clocked, polled, interrupt-driven, or token-passing mode. In addition, a four-wire serial interface 174 allows serial configuration of TAC gain and mode, arbitration locking, channel exclusion, and analog monitor functions.

All bias circuitry, resistors, and capacitors are preferably on-chip. To operate the chip, the user only has to supply power, threshold, and READ_REQUEST signal in addition to the input signals.

A multi-element sensor system formed in accordance with the present invention may be adapted for use, for example, in high-rate X-ray or gamma-ray spectroscopic imaging including medical imaging, cosmic ray imaging, nuclear instrumentation, and as a pulse processor or derandomizer in an instrument utilizing multiple sources. The multi-element sensor of the present invention advantageously provides analog first-in first-out (FIFO) operation, requires no trigger, and is straight-forward to implement as an integrated circuit. The multi-element sensor further substantially eliminates deadtime by allowing a high degree of multiplexing.

The sensor may also be operated as a high-resolution spectroscopy sensor system of any radiation generating event such as gamma rays, x-rays, cosmic rays or other ionizing particle hits. The energy of the event is proportional to the amplitude of the voltage pulse at the output of the amplifier. The signal processing electronics of the present invention extracts the amplitude, and either the time-of-occurrence or the pulse rise time of the event. In the case of high-resolution spectroscopy, the rise time mode is preferable. In this case, pulses are generated from at least one detector on at least one channel and the pulse data converted to digital form in an efficient manner and at high speed.

Experiment 1—ASIC Simulation

Figure 10A:
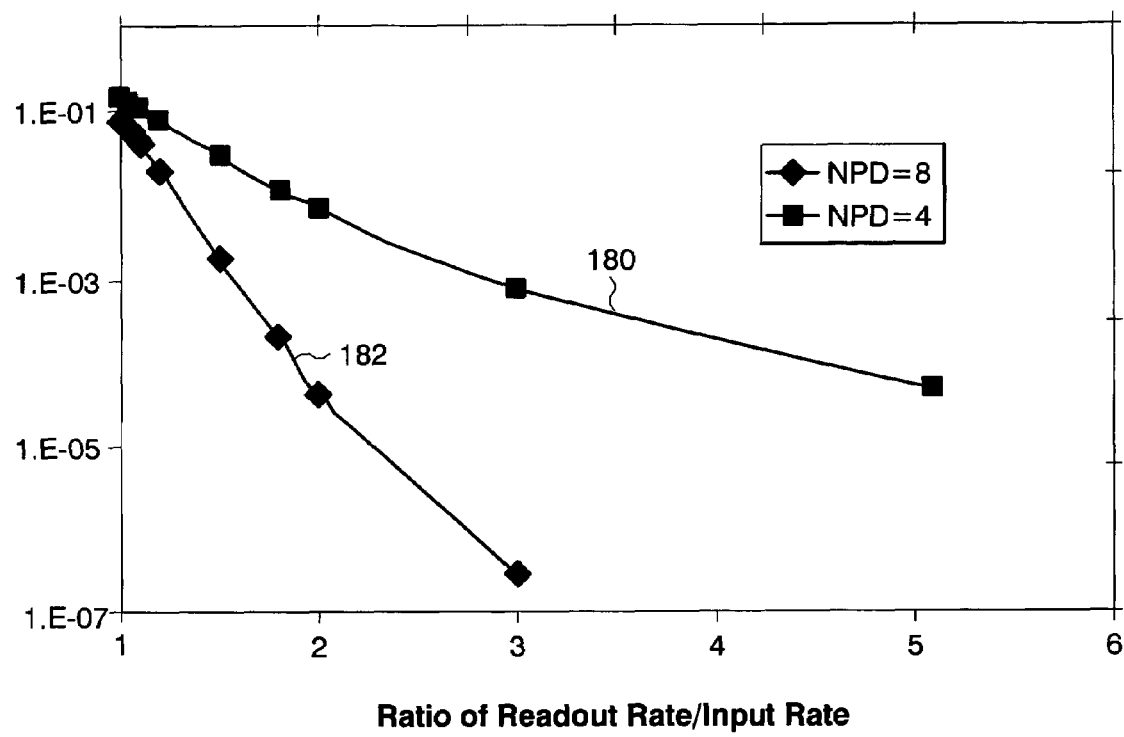
FIG. 10a is a plot of the probability that events will be blocked as a function of a ratio of readout rate to an average input rate of events, which corresponds to two embodiments of the present invention: one having four (4) peak detectors and one having eight (8) peak detectors.

Monte Carlo simulations of the peak detector FIFO queue were performed for 500,000 events. In this simulation, the operation of the arbitration logic was not modeled. Randomly arriving pulses of 50 ns peaking time were input into an array of peak detectors which were assumed to complete processing after one peaking time. The inefficiency (fraction of events blocked) was recorded as a function of the ratio of the readout rate to the average input event rate. FIG. 10a shows the blocking probability for a 4-PD array 180 and an 8-PD array 182. The abscissa is the readout rate expressed in units of the average input rate. The simulation of FIG. 10a was performed with a fixed input rate of 640 Hz and a varying readout rate. A low value of input rate is appropriate for the case when the rate is much less than the inverse of the peaking time.

Figure 10B:
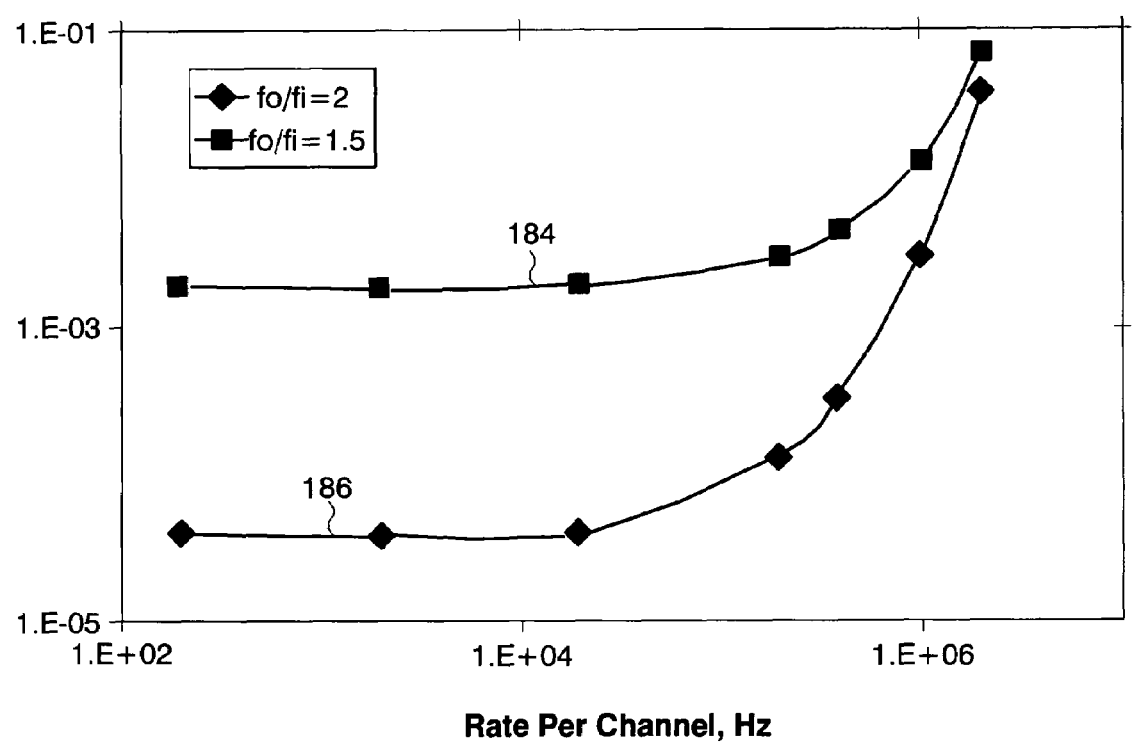
FIG. 10b is a plot of the probability that events will be blocked as a function of an average input rate of events per channel for an eight (8) peak detector array.

In FIG. 10b, the inefficiency is given for an 8-PD array as a function of input rate per channel, when the READ_REQUEST signal frequency was fixed at 1.5 times (184) and 2.0 times (186) the average event rate. For eight peak detectors, the efficiency is excellent up to rates in excess of 1 MHz/channel. The inefficiency rises at high rates when the peaking time becomes an appreciable fraction of the average inter-arrival time.

FIG. 7 shows a 40 microsecond portion of a full transistor-level (BSIM 3v3.1). SPICE simulation of the circuit with pulses on 16 inputs, which was also performed. To simulate the signals expected in a spectroscopy experiment, the arrival times of the pulses are Poisson distributed with a mean rate of 100 kHz per channel. Amplitudes of the pulses are random, and peaking times of 50 nanoseconds (ns) to 1 ns are used. The circuit responds to read request signals by outputting the peak sample from each channel that was hit. The address and time of the corresponding hit are also output.

Experiment 2

A chip was fabricated in a 0.35 DP-4M CMOS process. Die size is 3.2×3.2 mm and is pad-limited. Power consumption is less than 2 mW/channel.

Preliminary measurements on a first prototype ASIC were made. The results were arrived at using 8-bit sampling oscilloscopes and have not been corrected for other systematic inaccuracies. The chip contains thirty-two (32) channels, 32 comparators and eight (8) offset-free two-phase peak detectors with associated TACs. The crosspoint switch is a 32-to-8 crosspoint switch (addressable matrix of 256 CMOS switches) that can route any input channel to any PD/TAC.

The amplitude accuracy and uniformity of the eight peak detectors were measured with a burst of eight Gaussian-shaped pulses on the first input channel, followed by a burst of eight READ-REQUESTS. The root-mean-square (RMS) error in peak height was 0.27%, and the uniformity among the eight PDs was also within 0.3%.

Figure 11A:
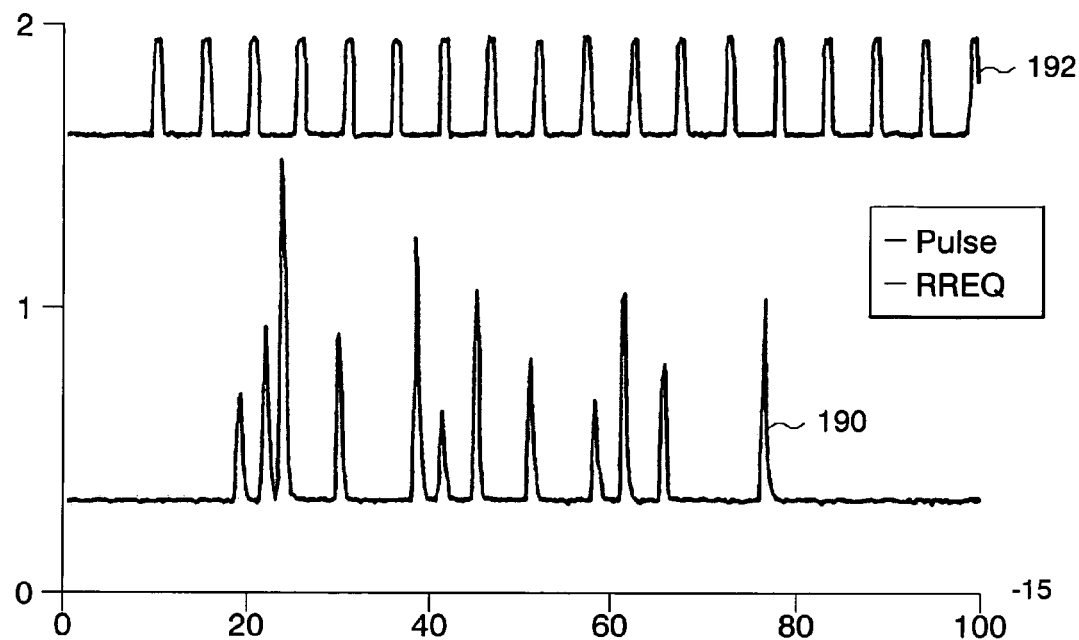
FIG. 11a is a plot of generated pulse inputs and read request signals for testing an ASIC fabricated in accordance with the present invention.
Figure 11B:
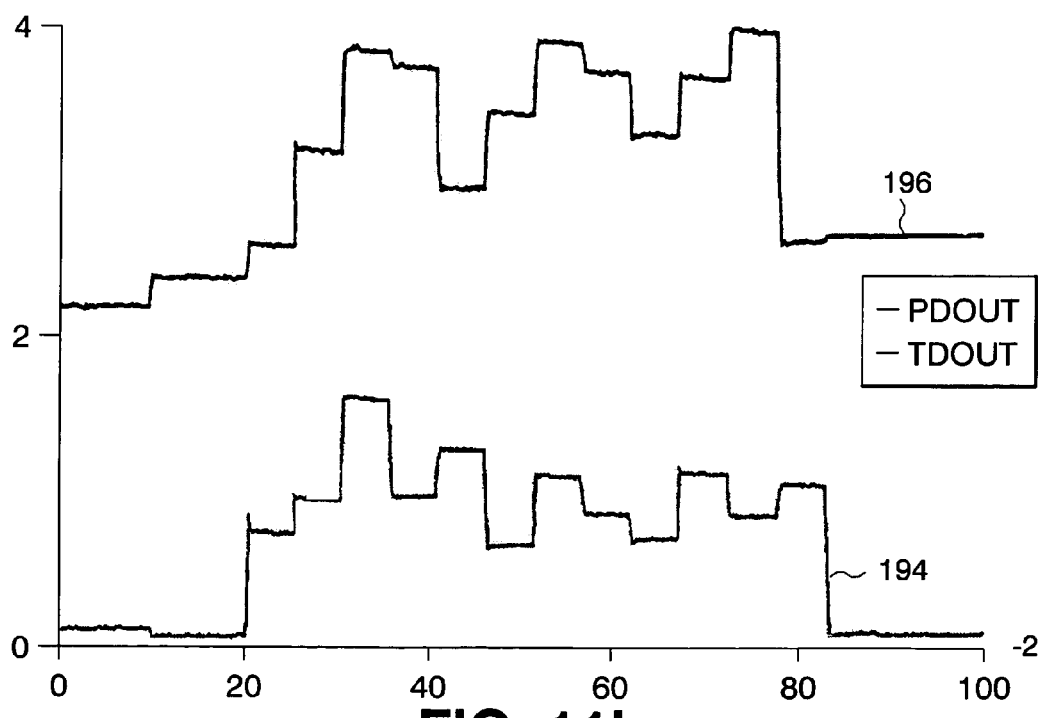

FIG. 11a and FIG. 11b show the inputs and primary outputs of the ASIC in response to a series of pulses arriving randomly. The twelve Gaussian pulses 190 (average rate 340 kHz, baseline 0.3 V) with peaking times of about 1 microsecond were generated with a Tektronix AWG 430 arbitrary waveform generator connected to the input of Channel 1; all other channels were inactive. The READ_REQUEST signal 192 rate was 275 kHz. FIG. 11b shows the outputs from the amplitude 194 and timing 196 channels (time-of-occurrence mode).

Figure 12:
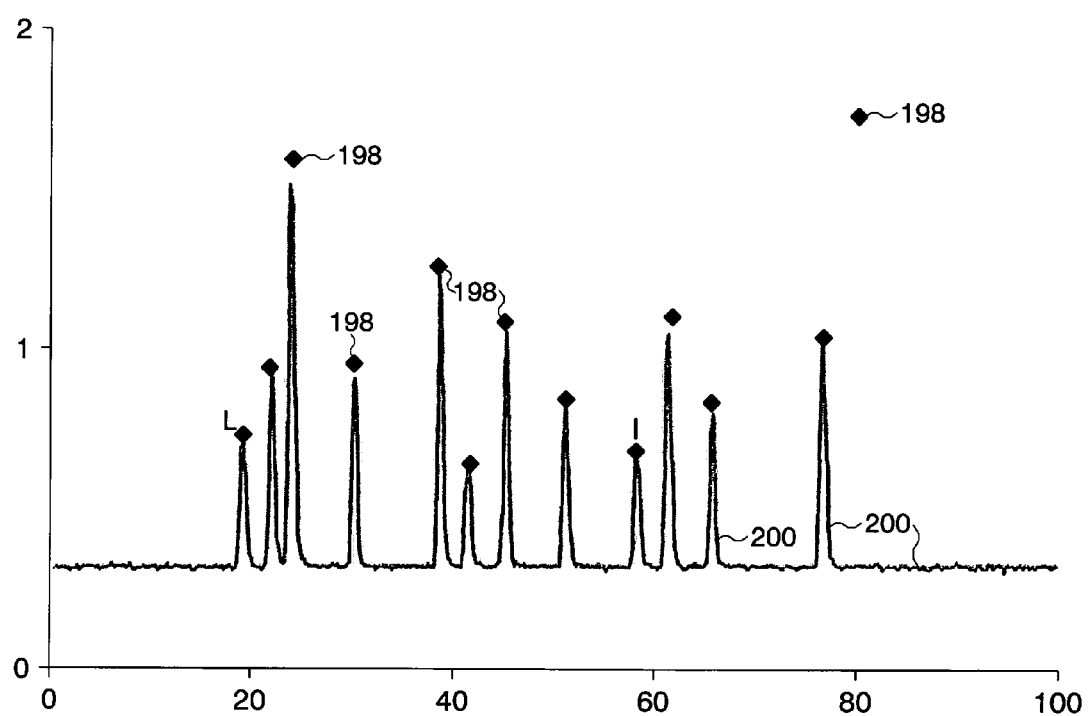
FIG. 12 is a plot of a reconstruction of the time and amplitude of the input pulses (shown as diamond-shaped points) superimposed over the actual input signals of FIG. 11a from the output signals plotted in FIG. 11b.

In FIG. 12, the data from FIG. 11b have been used to calculate the peak positions (amplitude and time), shown as diamond-shaped points 198 superimposed on the actual waveform data 200 shown in FIG. 11a. Accurate reconstruction of the pulse peaks is demonstrated. (Apparent discrepancies in pulse heights seen in FIG. 12 may be due to the limited sampling rate of the oscilloscope required to show all pulses on the same trace.)

The output of the TAC in time-of-occurrence mode was measured as the delay between pulse arrival and READ_REQUEST signal was varied. The results show that the RMS error is below 0.3% for four different settings of the TAC gain. The TAC also operated correctly in rise time mode. Pulses with peaking time as short as 30 ns were correctly processed by the ASIC, at repetition rates up to 1.6 MHz (single channel). The arbitration operated properly with 500 ns-wide pulses on two channels arriving within 40 ns of each other.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. A signal processing apparatus for processing pulses arriving randomly in time on at least one channel, a pulse having a time of arrival and an amplitude, the apparatus comprising:
   at least one trigger comparator, each trigger comparator having a trigger threshold voltage associated therewith, the at least one trigger comparator being associated with the at least one channel, each trigger comparator being adapted to generate a trigger signal in response to the amplitude of the pulse exceeding the trigger threshold voltage;
   a plurality of peak detectors;
   a switch adapted to connect the at least one channel receiving the pulse to one of the plurality of peak detectors in response to the trigger signal, the one of the plurality of peak detectors generating an analog signal representing a peak amplitude of the pulse; and
   a logic circuit, the logic circuit generating a write pointer, the write pointer asynchronously selecting the one of the plurality of peak detectors to be connected to the at least one channel receiving the pulse, the one of the plurality of peak detectors being the selected peak detector.

2. The apparatus defined by claim 1, further comprising at least one amplifier the at least one amplifier amplifying the pulse, the at least one trigger comparator being responsive to the at least one amplifier.

3. The apparatus defined by claim 1, further comprising:
   an analog multiplexer operatively coupled to the plurality of peak detectors; and
   an analog-to-digital converter, the analog-to-digital converter being responsive to the analog signal, the analog-to-digital converter digitizing the analog signal.

4. The apparatus defined by claim 1, wherein the logic circuit is responsive to at least one of the trigger signal, a peak found signal from at least one of the plurality of peak detectors, and a read request signal.

5. The apparatus defined by claim 1, the logic circuit further comprising a priority encoder, the priority encoder rejecting one of a first pulse and a second pulse in accordance with a priority scheme, the first pulse and the second pulse being generated in different channels, the time of arrival of the first pulse being substantially the same as the time of arrival of the second pulse.

6. The apparatus defined by claim 5, wherein the priority encoder rejects one of the first pulse and the second pulse associated with a higher channel address.

7. The apparatus defined by claim 1, wherein the write pointer selects the selected peak detector from the plurality of peak detectors in accordance with a sequence, the selected peak detector being not busy.

8. The apparatus defined by claim 4, wherein the logic circuit generates a read pointer, the read pointer enabling the analog-to-digital converter to operatively couple to the one of the plurality of peak detectors which is busy holding the analog signal in accordance with a first-in first-out (FIFO) queuing sequence.

9. The apparatus defined by claim 8, wherein the read request signal indicates when the analog-to-digital converter is ready to convert, the analog multiplexer operatively connecting the one of the plurality of peak detectors indicated by the read pointer to the analog-to-digital converter in response to the read request signal.

10. The apparatus defined by claim 8, further comprising a plurality of address registers, the at least one channel having a channel address, at least one of the plurality of address registers storing the channel address of the channel associated with the trigger signal, the write pointer and the read pointer being adapted to access the plurality of address registers in accordance with the first-in first-out (FIFO) queuing sequence.

11. The apparatus defined by claim 8, further comprising a plurality of time-to-amplitude converters, one of the plurality of time-to-amplitude converters outputting a time amplitude signal corresponding to one of the time of arrival and a pulse rise time of the pulse, the write pointer and the read pointer being adapted to access the plurality of time-to-amplitude converters in accordance with the first-in first-out queuing sequence.

12. The apparatus defined by claim 11, wherein at least one of the plurality of time-to-amplitude converters is adapted to measure the time of arrival of the pulse as a time interval between the peak found signal and the read request signal, the time interval being converted to a voltage, the one of the plurality of time-to-amplitude converters outputting a time amplitude signal corresponding to the time of arrival of the pulse.

13. The apparatus defined by claim 11, wherein at least one of the plurality of time-to-amplitude converters is adapted to measure the pulse rise time of the pulse as a time interval between the trigger signal and the peak found signal, the time interval being converted to a voltage, the one of the plurality of time-to-amplitude converters outputting a time amplitude signal corresponding to the pulse rise time of the pulse.

14. The apparatus defined by claim 11, comprising a second analog-to-digital converter, the second analog-to-digital converter being operatively connected to the plurality of time-to-amplitude converters via the analog multiplexer, the second analog-to-digital converter digitizing the time amplitude signal in accordance with the first-in first-out (FIFO) queuing sequence.

15. The apparatus defined by claim 1, wherein the apparatus is adapted for implementation in one of a monolithic circuit and an Application Specific Integrated Circuit (ASIC).

16. The apparatus defined by claim 7, wherein a number M representing a quantity of peak detectors is less than a number N representing a quantity of trigger comparators and the number N representing a quantity of channels, and wherein the switch comprises an N-to-M crosspoint switch.

17. The apparatus defined by claim 8, wherein the analog multiplexer comprises an M-to-1 analog multiplexer, M representing a quantity of peak detectors.

18. The apparatus defined by claim 17, wherein M is greater than a number N representing a quantity of trigger comparators and the number N representing a quantity of channels, and wherein the switch comprises an N-to-M crosspoint switch.

19. The apparatus defined by claim 1, wherein at least one of the plurality of peak detectors comprises a pre-charged input, the pre-charged input being held at the trigger threshold voltage before the at least one of the plurality of peak detectors is selected as the selected peak detector.

20. The apparatus defined by claim 1, wherein the pulses arriving randomly in time are input from at least one detector element to the at least one channel, the at least one channel being associated with the at least one detector element, wherein each of the pulses arriving randomly in time is associated with an event at the at least one detector element, the amplitude of the pulse representing an energy of the event and the time of arrival of the pulse representing the time-of-occurrence of the event.

21. A method of processing pulses arriving randomly in time on at least one channel using a plurality of peak detectors, a pulse having a time of arrival and an amplitude, comprising the steps of:
   selecting a first peak detector, the first selected peak detector being asynchronously selected from the plurality of peak detectors, the first selected peak detector being not busy;
   inputting a first pulse having a first amplitude on a first channel, the first channel being the at least one channel receiving the first pulse;
   generating a first trigger signal in response to the first pulse;
   connecting the first channel to the first selected peak detector in response to the first trigger signal; and
   detecting a first peak amplitude from the first amplitude of the first pulse.

22. The method according to claim 21, the method further comprising the step of:
   selecting a second peak detector, the second selected peak detector being asynchronously selected from the plurality of peak detectors, the second selected peak detector being not busy;
   inputting a second pulse having a second amplitude on a second channel, the second channel being the at least one channel receiving the second pulse, the first channel being one of the same as the second channel and different from the second channel;
   generating a second trigger signal in response to the second pulse;
   connecting the second channel to the second selected peak detector in response to the second trigger signal;
   detecting a second peak amplitude from the second amplitude of the second pulse; and
   outputting a first amplitude signal comprising the first peak amplitude and a second amplitude signal comprising the second peak amplitude in accordance with a first-in first-out queuing sequence.

23. The method according to claim 22, wherein the step of outputting comprises:
   outputting the first amplitude signal in response to a first read request signal; and
   outputting the second amplitude signal in response to a second read request signal in accordance with the first-in first-out queuing sequence.

24. The method according to claim 22, wherein the step of generating the first trigger signal further comprises the steps of:
   comparing the first amplitude to a trigger threshold voltage; and
   generating the first trigger signal in response to the first pulse exceeding the trigger threshold voltage.

25. The method according to claim 22, wherein the step of selecting the second peak detector further comprises selecting the second peak detector from a predetermined sequence.

26. The method according to claim 22, further comprising disconnecting the first channel from the first selected peak detector in response to detecting the first peak amplitude.

27. The method according to claim 22, further comprising blocking at least one channel from connecting to one of the plurality of peak detectors.

28. The method according to claim 22, further comprising the steps of:
   locking at least one channel to an output; and
   measuring a baseline voltage of at least one pulse arriving on the at least one channel.

29. The method according to claim 22, the at least one channel being associated with a channel address, the method further comprising the steps of:
   selecting a first address register from a plurality of address registers, the first selected address register being asynchronously selected from a plurality of address registers in accordance with a register sequence, the first selected address register being not busy;
   generating a first channel signal in response to the first trigger signal, the first channel signal comprising a first channel address associated with the first channel;
   storing the first channel signal in the first selected address register;
   selecting a second address register from the plurality of address registers, the second selected address register being asynchronously selected from the plurality of address registers in accordance with the register sequence, the second selected address register being not busy;
   generating a second channel signal in response to the second trigger signal, the second channel signal comprising a second channel address associated with the second channel;
   storing the second channel signal in the second selected address register; and
   outputting the first channel signal and the second channel signal in accordance with a first-in first-out queuing sequence.

30. The method according to claim 29, wherein the step of outputting comprises outputting the first channel signal in response to the first read request signal and outputting the second channel signal in response to the second read request signal in accordance with the first-in first-out queuing sequence.

31. The method according to claim 22, wherein M represents a quantity of peak detectors and N represents a quantity of channels, M being less than N.

32. The method according to claim 31, wherein the step of connecting the first channel further comprises closing a switch in an N-to-M crosspoint switch between the first channel and the first selected peak detector.

33. The method according to claim 22, further comprising:
   converting a first time interval associated with one of a first time of arrival of the first pulse and a first rise time of the first pulse to a first time amplitude signal;
   converting a second time interval associated with one of a second time of arrival of the second pulse and a second rise time of the second pulse to a second time amplitude signal; and
   outputting the first time amplitude signal and the second time amplitude signal in accordance with the first-in first-out queuing sequence.

34. The method according to claim 33, the step of outputting the first time amplitude signal and the second time amplitude signal further comprising:

outputting the first time amplitude signal in response to a first read request signal; and outputting the second time amplitude signal in response to the second read request signal.

35. The method according to claim 34, wherein the step of converting the first time interval is the step of converting the first time interval associated with the first time of arrival, the step of converting further comprising:

generating a first voltage ramp signal starting at an initial voltage in response to detecting the first peak amplitude;

reading a first stop voltage in response to the first read request signal, the first stop voltage corresponding to the first voltage ramp at the time the first read request signal is received; and measuring the first time amplitude signal as a difference between the first stop voltage and the initial voltage.

36. The method according to claim 34, wherein the step of converting the first time interval is the step of converting the first time interval associated with the first rise time, the step of converting further comprising:

generating a first voltage ramp signal starting at an initial voltage in response to the first trigger signal;

reading a first stop voltage in response to detecting the first peak amplitude, the first stop voltage corresponding to the first voltage ramp at the time corresponding to detecting the first peak amplitude; and measuring the first time amplitude signal as a difference between the first stop voltage and the initial voltage.

37. The method according to claim 33, further comprising the steps of:

digitizing the first peak amplitude analog signal and the second peak amplitude analog signal; and digitizing the first time amplitude signal and the second time amplitude signal.

38. The method according to claim 22, further comprising the step of rejecting the second pulse in response to the plurality of peak detectors being busy.

39. The method according to claim 22, wherein the first pulse and the second pulse are input at substantially the same time in different channels, the method further comprising the step of rejecting one of the first pulse and the second pulse in accordance with a priority scheme.

40. The method according to claim 39, wherein the step of rejecting further comprises the step of rejecting one of the first pulse and the second pulse associated with the higher channel address.

41. The method according to claim 22, wherein M represents a quantity of peak detectors, the step of outputting further comprising connecting the first selected peak detector to an M-to-1 multiplexer.

42. The method according to claim 29, wherein M represents a quantity of address registers, N represents a quantity of channels, wherein M is less than N, the method further comprising connecting the first channel signal to the first selected address register through an N-to-M crosspoint switch.

43. The method according to claim 24, further comprising pre-charging an input of the first selected peak detector to the trigger threshold voltage before the step of connecting to the first selected peak detector.

44. The method according to claim 22, wherein at least one of the steps of detecting the first peak amplitude comprises detecting the first peak amplitude of the first pulse within a time interval, the method further comprising the steps of:

disconnecting the first channel from the first selected peak detector in response to not detecting the first signal pulse within the time interval;

resetting the first selected peak detector; and marking the first selected peak detector not busy.

45. A sensor system for spectroscopy, the system comprising:

at least one detector element, the at least one detector element being adapted to generate a pulse in response to an event, the pulse having a time of arrival and an amplitude;

at least one channel, the at least one channel receiving the pulse from the at least one detector element;

at least one trigger comparator, the at least one trigger comparator having a trigger threshold voltage associated therewith, the at least one trigger comparator being associated with the at least one channel, the at least one trigger comparator being adapted to generate a trigger signal in response to the amplitude of the pulse exceeding the trigger threshold voltage;

a plurality of peak detectors;

a switch adapted to connect the at least one channel receiving the pulse to one of the plurality of peak detectors in response to the trigger signal, the one of the plurality of peak detectors generating an analog signal representing a peak amplitude of the pulse; and a logic circuit, the logic circuit generating a write pointer, the write pointer asynchronously selecting the one of the plurality of peak detectors to be connected to the at least one channel receiving the pulse, the one of the plurality of peak detectors being the selected peak detector, wherein the logic circuit is responsive to at least one of the trigger signal, a peak found signal from at least one of the plurality of peak detectors, and a read request signal.

46. The system defined by claim 45, wherein the write pointer selects the selected peak detector from the plurality of peak detectors in accordance with a sequence, the selected peak detector being not busy.

47. The system defined by claim 45, further comprising:

an analog multiplexer operatively coupled to the plurality of peak detectors; and an analog-to-digital converter, the analog-to-digital converter being responsive to the analog signal, the analog-to-digital converter digitizing the analog signal, wherein the logic circuit generates a read pointer, the read pointer enabling the analog-to-digital converter to operatively couple to the one of the plurality of peak detectors which is busy holding the analog signal in accordance with a first-in first-out (FIFO) queuing sequence.

48. The system defined by claim 47, further comprising a plurality of time-to-amplitude converters, one of the plurality of time-to-amplitude converters outputting a time amplitude signal corresponding to one of the time of arrival and time-of-occurrence of the pulse, the write pointer and the read pointer being adapted to access the plurality of time-to-amplitude converters in accordance with the first-in first-out queuing sequence.

49. The apparatus defined by claim 45, wherein M is less than a number N representing a quantity of trigger comparators and the number N representing a quantity of channels, and wherein the switch comprises an N-to-M crosspoint switch.

* * * * *